(12) United States Patent
Giuroiu

(10) Patent No.: US 6,377,085 B1
(45) Date of Patent: Apr. 23, 2002

(54) PRECISION BIAS FOR AN TRANSCONDUCTOR

(75) Inventor: Horia Giuroiu, Campbell, CA (US)

(73) Assignee: Oki Semiconductor, Sunnyvale, CA (US)

(*) Notice: Subject to any disclaimer, the term of this patent is extended or adjusted under 35 U.S.C. 154(b) by 0 days.

(21) Appl. No.: 09/705,868

(22) Filed: Nov. 6, 2000

(51) Int. Cl.[7] ................................................. H03K 5/22
(52) U.S. Cl. .......................... 327/66; 327/65; 327/563
(58) Field of Search ............................ 327/52, 53, 54, 327/64, 65, 66, 538, 543, 563

(56) References Cited

U.S. PATENT DOCUMENTS

| | | | | |
|---|---|---|---|---|
| 4,371,844 A | | 2/1983 | Boeke | 330/253 |
| 4,766,394 A | * | 8/1988 | Yukawa | 330/253 |
| 4,874,969 A | * | 10/1989 | Meadows | 327/73 |
| 4,983,929 A | | 1/1991 | Real et al. | 330/288 |
| 5,373,228 A | | 12/1994 | Holle | 323/315 |
| 5,541,539 A | * | 7/1996 | Schlachter | 327/78 |
| 5,867,067 A | | 2/1999 | Moriarty, Jr. | 330/288 |

OTHER PUBLICATIONS

Laker et al., K.R., Design of Analog Integrated Circuits and Systems. New York: McGraw–Hill 1994 pp. 363, 382 & 621.

Crawley et al, P.J., "Designing operational transconductance amplifiers for low voltage operation", IEEE International Symposium on Circuits and Systems, pp. 1455–1458, May 1993.

Krummenacher et al, Francois, "A 4–MHz CMOS continuous–time filter with on–chip automatic tuning," IEEE Journal of Solid–State Circuits, vol. 23, pp. 750–758, Jun. 1988.

Babanezhad et al., J.N., "A programmable gain/loss circuit," IEEE Journal of Solid–State Circuits, vol. SC–22, pp. 1082–1089, Dec. 1987.

* cited by examiner

*Primary Examiner*—Terry D. Cunningham
(74) *Attorney, Agent, or Firm*—Volentine Francos, PLLC

(57) ABSTRACT

A precision bias is provided for a differential transconductor. The precision bias includes a bias circuit, a differential amplifier and a current mirror. The current mirror includes at least two mirror transistors, one of which is connected to the bias circuit, and th other of which is connected to the differential amplifier. The bias circuit provides a bias current, which the current mirror accurately reflects to the differential amplifier as a tail current. By providing identical operating conditions to the bias circuit and first mirror transistor as are seen at the differential amplifier and second mirror transistor, the precision bias can more accurately reflect the bias current into the tail current. This can reduce the DC output currents of the differential amplifier to substantially zero, which improves its performance. A second bias circuit provides the gate-source voltage of the two transistors forming the load of the differential transconductor.

11 Claims, 15 Drawing Sheets

PRECISION BIAS FOR AN TRANSCONDUCTOR

BACKGROUND OF THE INVENTION

The present invention relates to the biasing of a differential stage with active load, e.g., a transconductor. More particularly, the present invention relates to a precision biasing circuit in which the biasing circuit and the main circuit have almost identical biasing conditions.

The transconductance of a differential stage is controlled by its tail current. The tail current is in turn obtained by mirroring a reference current. In certain applications like controlled amplifiers or continuous-time filters that use transconductors, the reference current is used to adjust some of the characteristics of the transconductor (e.g. the transconductance). The accuracy of the replication of the reference current directly affects the performance of the transconductor, and so it is desirable to provide a circuit that very accurately replicates a reference current.

It would also be desirable to accurately mirror the reference current, especially for a low supply voltage.

Some applications, like programmable gain amplifiers, require a transconductor to be switched onto and off of a low input impedance stage, such as a cascode or a folded-cascode. In the latter case, the folded-cascode generally has a fully differential configuration and has its bias set by an output common-mode control loop. If there is a net DC output current from the transconductor, the common-mode control loop has to adjust the bias of the output stage every time the configuration changes by switching ON or OFF transconductors.

It would also be desirable to be able to accurately bias the active load of a differential stage in order to reduce the DC output currents of the differential stage connected to a folded-cascode current to be substantially zero.

FIG. 1 shows a conventional circuit 100 for biasing a differential stage. The circuit includes a differential stage 105, a lower current mirror 110, an upper current mirror 120, a bias current source 125, and first and second voltage sources 130 and 135, representing the equivalent circuits of low impedance loads, e.g., as seen in FIG. 5 below.

The differential stage 105 includes first through fourth differential transistors $T_{D1}$, $T_{D2}$, $T_{D3}$, and $T_{D4}$. The lower current mirror 110 includes first and second mirror transistors $T_{M1}$ and $T_{M2}$. The upper current mirror 120 includes a third mirror transistor $T_{M3}$ and the third and fourth differential transistors $T_{D3}$ and $T_{D4}$. The input transistors $T_{D1}$ and $T_{D2}$ are driven with respect to the common mode voltage $V_{COM}$ by the voltages $v_{id}/2$ and $-v_{id}/2$, respectively.

A tail current $I_T$ is obtained by mirroring a reference current $I_{BIAS}$ through the first and second mirror transistors $T_{M1}$ and $T_{M2}$. Under ideal conditions, the tail current can be calculated as follows.

$$I_T = 2n \cdot I_{BIAS} \quad (1)$$

where n is determined by the ratio of the geometric features of first and second mirror transistors $T_{M1}$ and $T_{M2}$ as follows.

$$n = \frac{1}{2} \cdot \frac{\left(\frac{W_{M1}}{L_{M1}}\right)}{\left(\frac{W_{M2}}{L_{M2}}\right)} \quad (2)$$

where $W_{M1}$ is the width of the first mirror transistor, $L_{M1}$ is the length of the first mirror transistor, $W_{M2}$ is the width of the second mirror transistor, and $L_{M2}$ is the length of the second mirror transistor.

The accuracy of the mirroring is affected by the usually different drain-source voltages of the first and second mirror transistors $T_{M1}$ and $T_{M2}$.

One way to improve the current mirroring is to use cascode current mirrors, as shown in FIG. 2. The circuit of FIG. 2 includes a differential stage 105, a cascode current mirror 210, a bias current generator 125, and first and second voltage sources 130 and 135. The cascode current mirror 210 includes fourth, fifth, sixth, and seventh mirror transistors $T_{M4}$, $T_{M5}$, $T_{M6}$, and $T_{M7}$.

However, the cascode current mirrors have minimum voltage requirements that in many low-voltage deep-submicron circuits cannot be accommodated. As a result, the voltage at the node B must meet the following equality:

$$V_{Bmin} = 2 \cdot \Delta V + V_{TH} \quad (3)$$

where $V_{TH}$ is the threshold voltage of the fourth, fifth, sixth, and seventh mirror transistors $T_{M4}$, $T_{M5}$, $T_{M6}$, and $T_{M7}$, and $$\Delta V = \sqrt{\frac{I_T}{K\left(\frac{W_{M6}}{L_{M6}}\right)}} \quad (4)$$

where $I_T$ is the tail current, $W_{M6}$ is the width of the sixth mirror transistor $T_{M6}$, $L_{M6}$ is the length of the sixth mirror transistor $T_{M6}$, and K is a process-dependent parameter calculated as follows.

$$K = \frac{\mu \cdot C_{ox}}{2} \quad (5)$$

where $\mu$ is the average mobility of the majority carriers in the channel, and $C_{ox}$ is the specific capacitance of the gate oxide.

For these equations, it is assumed that all of the bias transistors in one chain ($T_{M5}$ and $T_{M7}$, $T_{M4}$ and $T_{M6}$) are identical, and the body effect is neglected. Unfortunately, the minimum voltage on the B node $V_{Bmin}$ limits the input voltage range of the differential pair formed by the first and second differential transistors $T_{D1}$ and $T_{D2}$.

A circuit using for bias a high swing cascode is shown in FIG. 3. The circuit of FIG. 3 includes a differential stage 105, a high swing cascode current mirror 310, first and second bias current sources 323 and 327, and first and second voltage sources 130 and 135. The high swing cascode current mirror 310 includes eighth through twelfth mirror transistors $T_{M8}$ to $T_{M12}$.

The first and second bias current sources 323 and 327 do not necessarily supply the same current. Their output currents depend upon the relative sizes of the transistors $T_{M10}$, $T_{M11}$, and $T_{M12}$.

The circuit shown in FIG. 3 acts to lessen the minimum voltage at the node B to:

$$V_{Bmin} = 2 \cdot \Delta V \quad (5)$$

Unfortunately, this may still not be low enough for certain bias conditions. In fact, many circuits require constant transconductance over process, temperature and power supply variations, which can easily cause a need for a 2:1 change in the bias current.

In each of the designs disclosed in FIGS. 1 to 3, the third and fourth differential transistors $T_{D3}$ and $T_{D4}$ of the differential pair 105 act as fixed current sources. In addition, the differential pair 105 itself also acts as a controlled current source. The output current of each branch of the differential stage $T_{D15}$, $T_{D2}$, $T_{D3}$, and $T_{D4}$ is injected into an ideally zero input impedance stage, i.e., the first and second voltage sources 130 and 135.

FIG. 4 shows and alternate configuration in which a transconductor is followed by a folded-cascode stage. The circuit of FIG. 4 includes a differential stage 405 (voltage-to-current converter), a current mirror 110, a bias current source 125, and a folded-cascode 450. The folded-cascode 450 includes first through fourth folded-cascode transistors $T_{FC1}$ to $T_{FC4}$, a voltage amplifier 460, and first and second load current sources 470 and 475, and provides first and second output currents $I_{O1}$ and $I_{O2}$. The differential stage 405 includes first and second differential transistors $T_{D1}$ and $T_{D2}$.

In the circuit of FIG. 4, the loads of the differential stage are merged with the current sources of the folded-cascode and appear as the third and fourth folded-cascode transistors $T_{FC3}$ and $T_{FC4}$. Their currents are controlled by a common-mode feedback loop including the first and second transistors $T_{FC1}$ and $T_{FC2}$, and the voltage amplifier 460.

FIG. 5 shows a folded-cascode transconductor that employs a separate input stage and folded-cascode for an NMOS differential stage. The circuit of FIG. 5 includes a differential stage 105, a lower current mirror 110, an upper current mirror 120, a bias current source 125, and a folded-cascode 450. The differential stage 105 provides first and second DC output currents $I_{DCO1}$ and $I_{DCO2}$ to the folded-cascode 450.

A circuit similar to that of FIG. 5 is shown, for example, in J- E. Kardontchik, *Introduction to the Design of Transconductor-Capacitor Filters*, Kluwer International Series in Engineering and Computer Sciences, 1992, which is incorporated by reference in its entirety. The purpose of this design is to have zero DC output currents $I_{DCO1}$ and $I_{DCO2}$ from the differential amplifier 105.

However, because of the different drain-source voltage of the transistors in the upper current mirror 120 (i.e., $T_{D3}$, $T_{D4}$, and $T_{M1}$), first and second currents $I_{D3}$ and $I_{D4}$ flowing through the third and fourth differential transistors $T_{D3}$ and $T_{D4}$ will be different from the ideally mirrored bias current n·$I_{BIAS}$. As a result, because of the imperfections affecting both the upper current mirror 120 and the lower current mirror 110, there are net DC output currents $I_{DCO1}$ and $I_{DCO2}$ flowing out of the differential stage 105. In this case, 'n' is the value determined by equation (2).

In other words, under ideal circumstances, $$I_T = (I_{D3} + I_{D4}) = (I_{D1} + I_{D2}) \tag{7}$$

However, because the current mirrors 110 and 120 are imperfect, this equality is not correct. As a result, $(I_{D3} \neq I_{D1})$ and $(I_{D4} \neq I_{D2})$, which makes the DC output currents $I_{DCO1}$ and $I_{DCO2}$ non-zero.

FIG. 6 is a circuit diagram of a conventional two-input stage differential output folded-cascode with separated loads for the input stages. The circuit of FIG. 6 includes primary and secondary differential stages 605a and 605b, a lower current mirror 610, an upper current mirror 620, a bias current source 125, and a folded-cascode 450. As shown in FIG. 6, this circuit uses multiple differential stages 605a and 605b in association with a single folded-cascode 450.

The primary differential stage 605a includes first through fourth primary transistors $T_{D1A}$, $T_{D2A}$, $T_{D3A}$, and $T_{D4A}$. The primary differential stage 605a provides first and second DC output currents $I_{DCO1}$ and $I_{DCO2}$ to the folded-cascode 450. The secondary differential stage 605b includes first through fourth secondary transistors $T_{D1B}$, $T_{D2B}$, $T_{D3B}$, and $T_{D4B}$. The secondary differential stage 605b provides third and fourth DC output currents $I_{DCO3}$ and $I_{DCO4}$ to the folded-cascode 450.

The lower current mirror 610 includes thirteenth through fifteenth mirror transistors $T_{M13}$ to $T_{M15}$. The upper current mirror 620 includes a sixteenth mirror transistor $T_{M16}$, the third and fourth current source transistors $T_{D3A}$ and $T_{D4A}$, and the third and fourth current source transistors $T_{D3B}$ and $T_{D4B}$.

FIG. 7 is a circuit diagram of a conventional switched input stages differential output folded-cascode with separated loads for the input stages. The circuit of FIG. 7 includes primary and secondary differential stages 605a and 605b, a lower current mirror 610, an upper current mirror 620, a bias current source 125, a folded-cascode 450, and first through fourth MOS switches $S_1$ to $S_4$.

As shown in FIG. 7, the transconductors, i.e., the differential stages 605a and 605b, in this circuit must be switched on and off of the folded-cascode 450. In this design, the differential stages 605a and 605b are connected to the folded-cascode 450 through the switches $S_1$, $S_2$, $S_3$, and $S_4$. In particular, the primary differential stage 605a is connected to the folded-cascode 450 through the first and second switches $S_1$ and $S_2$, and the secondary differential stage 605b is connected to the folded-cascode 450 through the third and fourth switches $S_3$ and $S_4$.

Because of the imperfections in the upper and lower current mirrors 610 and 620, there are net DC output currents $I_{DCO1}$, $I_{DCO2}$, $I_{DCO3}$, and $I_{DCO4}$ flowing out of the primary and secondary differential stages 605a and 605b. When the input stages are switched on or off, these non-zero DC output currents will force the output stage, i.e., the folded-cascode 450, to adjust its operating point through a common-mode feedback. Unfortunately, the changing of the operating point of the output stage can be detrimental to its performance, and should be avoided, if possible.

It would therefore be desirable to provide a precision bias for a transconductor in which the bias circuit and the main circuit have substantially identical operating conditions.

SUMMARY OF THE INVENTION

It is thus an object of the present invention to provide a precision biasing circuit that can accurately provide for the biasing of a differential stage having an active load. It is also an object of the present invention to accurately reflect a bias current into the differential stage.

In an effort to meet these and other objects of the invention, and according to one aspect of the present invention, a precision bias for a differential transconductor is provided. The precision bias comprises: a bias circuit for providing a bias current; a differential amplifier for receiving a tail current; and a first mirror transistor for receiving the bias current from the bias circuit; a second mirror transistor, connected to the first mirror transistor in a current mirror configuration, for providing the tail current to the differential amplifier. The drain-to-source voltages of the first and second mirror transistors are preferably substantially the same.

The bias circuit may comprise a bias current source for providing the bias current; and a bias transistor formed between the bias current source and the first mirror transistor, the bias transistor operating to supply the same drain-to-source voltage to the first mirror transistor that the differential amplifier supplies to the second mirror transistor. The drain of the bias transistor may be connected to the gates of the first and second mirror transistors. The differential amplifier may comprise first and second differential transistors connected as a differential pair. The gate of the bias transistor may be connected to a voltage equal to the input common mode voltage of the differential amplifier, wherein $$\frac{W_{D1}}{L_{D1}} = \frac{W_{D2}}{L_{D2}} = n \cdot \frac{W_B}{L_B},$$

and wherein $$\frac{W_{M2}}{L_{M2}} = 2n \cdot \frac{W_{M1}}{L_{M1}},$$

where $W_{D1}$ and $L_{D1}$, and $W_{D2}$ and $L_{D2}$, are the widths and lengths of the first and second differential transistors, respectively, $W_{M1}$ and $L_{M1}$, and $W_{M2}$ and $L_{M2}$, are the widths and lengths of the first and second mirror transistors, respectively, $W_B$ and $L_B$ are the width and length of the bias transistor, and n is an positive number. The bias circuit may further comprise a non-inverting amplifier connected between the drain of the bias transistor and the gates of the first and second mirror transistors.

The differential amplifier may comprise: first and second differential transistors, each having a source terminal connected to a drain of the second mirror transistor; a third differential transistor having a drain connected to the drain of the first differential amplifier, acting as a first load; and a fourth differential transistor having a drain connected to the drain of the second differential amplifier, acting as a second load. The current of the third differential transistor preferably substantially matches the current of the first differential transistor, and the current of the fourth differential transistor preferably substantially matches the current of the second differential transistor.

Also to achieve the goals of the current invention, there is provided a precision bias for a differential transconductor that comprises: a bias transistor for providing a bias current, having a gate connected to a common voltage and a drain connected to a first reference node; a first level-setting amplifier connected between a supply voltage and ground, having a first control voltage from the first reference node as input, and a first level-setting voltage as output; an inverting amplifier for generating a first current setting voltage by inverting, amplifying, and level shifting the first level setting voltage; a first current generator connected to the supply voltage, for receiving the first current setting voltage as an input, for generating a tail current, and for generating the bias current at a source of the bias transistor; a second current generator connected to ground, for receiving a bias voltage as a second current generator input, and for generating the bias current to be injected into the first reference node, and for generating first and second load currents equal to half the tail current to the second and third reference nodes, respectively; a differential stage for receiving the tail current from the first current generator, and supplying the first and second load currents to the second and third loads, respectively; a second level-setting amplifier connected between the supply voltage and ground, having a second control voltage as input, and a second level-setting voltage as output; a third level-setting amplifier connected between the supply voltage and ground, having a third control voltage as input, and a third level-setting voltage as output; a folded cascode connected between the supply voltage and ground for receiving the second and third level-setting voltages, a second current from the second node, and a third current from the third node as inputs, and for providing the second and third control voltages and first and second output currents as outputs, wherein the first, second, and third control voltages are the same.

The first level-setting amplifier may comprise a first level-setting current source and a first level-setting transistor connected in series; a gate of the first level-setting transistor may receive the first control voltage; and a first output node between the first level-setting current source and the first level-setting transistor may provide the first level-setting voltage. The second level-setting amplifier comprises a second level-setting current source and a second level-setting transistor connected in series. A gate of the second level-setting transistor preferably receives the second control voltage, and a second output node between the second level-setting current source and the second level-setting transistor preferably provides the second level-setting voltage.

The third level-setting amplifier preferably comprises a third level-setting current source and a third level-setting transistor connected in series, where a gate of the third level-setting transistor receives the third control voltage, and a third output node between the third level-setting current source and the third level-setting transistor provides the third level-setting voltage.

The first current generator preferably comprises first and second current generation transistors, the first current generation transistor providing the bias current and the second current generation transistor providing the tail current. Preferably, the following equalities are true:

$$\frac{W_{D1}}{L_{D1}} = \frac{W_{D2}}{L_{D2}} = n \cdot \frac{W_B}{L_B}, \text{ and } \frac{W_{CG2}}{L_{CG2}} = 2n \cdot \frac{W_{GCG1}}{L_{CG1}},$$

where $W_{D1}$ and $L_{D1}$, and $W_{D2}$ and $L_{D2}$, are the widths and lengths of the first and second differential transistors, respectively, $W_{CG1}$ and $L_{CG1}$, and $W_{CG2}$ and $L_{CG2}$, are the widths and lengths of the first and second current generation transistors, respectively, $W_B$ and $L_B$ are the width and length of the bias transistor, and n is an positive number.

The second current generator preferably comprises third, fourth, and fifth current generation transistors. Among these current generator transistors, the following equality is preferably true:

$$\frac{W_{CG3}}{L_{CG3}} = \frac{W_{CG4}}{L_{CG4}} = n \cdot \frac{W_{CG5}}{L_{CG5}}.$$

The differential stage preferably comprises first and second differential transistors, where the first and second differential transistors receive the tail current at their respective sources, the first differential transistor has its drain connected to the second reference node, the second differential transistor has its drain connected to the third reference node, the first and second differential transistors are driven with respect to the common voltage by first and second differential voltages, respectively, and the first and second differential voltages are substantially identical in magnitude, but opposite in polarity.

To further achieve the goals of the present invention, another precision bias for a differential transconductor is provided. This precision bias comprises: a first bias transistor for providing a first bias current, having a first gate connected to a common voltage and a first drain connected to a first reference node; a first level-setting amplifier connected between a supply voltage and ground, having a first control voltage from the first reference node as input, and a first level-setting voltage as output; a first inverting amplifier for generating a first current setting voltage by inverting, amplifying, and level shifting the first level setting voltage; a first current generator connected to the supply voltage, for receiving the first current setting voltage as an input, for generating a tail current, for generating the first bias current at a source of the first bias transistor, and for generating a second bias current at a source of the second bias transistor; a second bias transistor for receiving the second bias current, having a second gate connected to a common voltage and a second drain connected to a second reference node; a second level-setting amplifier connected between the supply voltage and ground, having a second control voltage from the second reference node as input, and a second level-setting voltage as output; a second inverting amplifier for generating a second current setting voltage by inverting, amplifying, and level shifting the second level setting voltage; a second current generator connected to ground, for receiving the second current setting voltage as a second current generator input, and for generating the second bias current to be injected into the second reference node, and for generating first and second load currents equal to half the tail current to third and fourth reference nodes, respectively; a differential stage for receiving the tail current from the first current generator, and supplying the first and second load currents to the second and third loads, respectively; a third level-setting amplifier connected between the supply voltage and ground, having a third control voltage as input, and a third level-setting voltage as output; a fourth level-setting amplifier connected between the supply voltage and ground, having a fourth control voltage as input, and a fourth level-setting voltage as output; and a folded cascode connected between the supply voltage and ground for receiving the third and fourth level-setting voltages, a third current from the third node, and a fourth current from the fourth node as inputs, and for providing the third and fourth control voltages and first and second output currents as outputs. The first, second, third, and fourth control voltages are preferably the same.

The first level-setting amplifier preferably comprises a first level-setting current source and a first level-setting transistor connected in series, where a gate of the first level-setting transistor receives the first control voltage, and a first output node between the first level-setting current source and the first level-setting transistor provides the first level-setting voltage.

The second level-setting amplifier preferably comprises a second level-setting current source and a second level-setting transistor connected in series, where a gate of the second level-setting transistor receives the second control voltage, and a second output node between the second level-setting current source and the second level-setting transistor provides the second level-setting voltage.

The third level-setting amplifier comprises a third level-setting current source and a third level-setting transistor connected in series, where a gate of the third level-setting transistor receives the third control voltage, and a third output node between the third level-setting current source and the third level-setting transistor provides the third level-setting voltage.

The fourth level-setting amplifier comprises a fourth level-setting current source and a fourth level-setting transistor connected in series, where a gate of the fourth level-setting transistor receives the fourth control voltage, and a fourth output node between the fourth level-setting current source and the fourth level-setting transistor provides the fourth level-setting voltage.

The first current generator preferably comprises first, second, and third current generation transistors, the first current generation transistor providing the first bias current, the second current generation transistor providing the second bias current, and the third current generation transistor providing the tail current.

In the first current generator, the following equalities are preferably true:

$$\frac{W_{D1}}{L_{D1}} = \frac{W_{D2}}{L_{D2}} = n \cdot \frac{W_B}{L_B}, \text{ and } \frac{W_{CG3}}{L_{CG3}} = 2n \cdot \frac{W_{CG1}}{L_{CG1}} = 2n \cdot \frac{W_{CG2}}{L_{CG2}},$$

where $W_{D1}$ and $L_{D1}$, and $W_{D2}$ and $L_{D2}$, are the widths and lengths of the first and third differential transistors, respectively, $W_{CG1}$ and $L_{CG1}$, $W_{CG2}$ and and $L_{CG2}$, and $W_{CG3}$ and $L_{CG3}$, are the widths and lengths of the first, second, and third current generation transistors, respectively, $W_B$ and $L_B$ are the width and length of the bias transistor, and n is an positive number.

The second current generator comprises fourth, fifth, and sixth current generation transistors. In the second current generator, the following equality is preferably true:

$$\frac{W_{CG4}}{L_{CG4}} = \frac{W_{CG5}}{L_{CG5}} = n \cdot \frac{W_{CG6}}{L_{CG6}}.$$

The differential stage comprises first and second differential transistors, where the first and second differential transistors receive the tail current at their respective sources, the first differential transistor has its drain connected to the second reference node, the second differential transistor has its drain connected to the third reference node, the first and second differential transistors are driven with respect to the common voltage by first and second differential voltages, respectively, and the first and second differential voltages are substantially identical in magnitude, but opposite in polarity.

BRIEF DESCRIPTION OF THE DRAWINGS

The above and other objects and advantages of the present invention will become readily apparent from the description that follows, with reference to the accompanying drawings, in which.

DETAILED DESCRIPTION OF THE PREFERRED EMBODIMENTS

Figure 1:
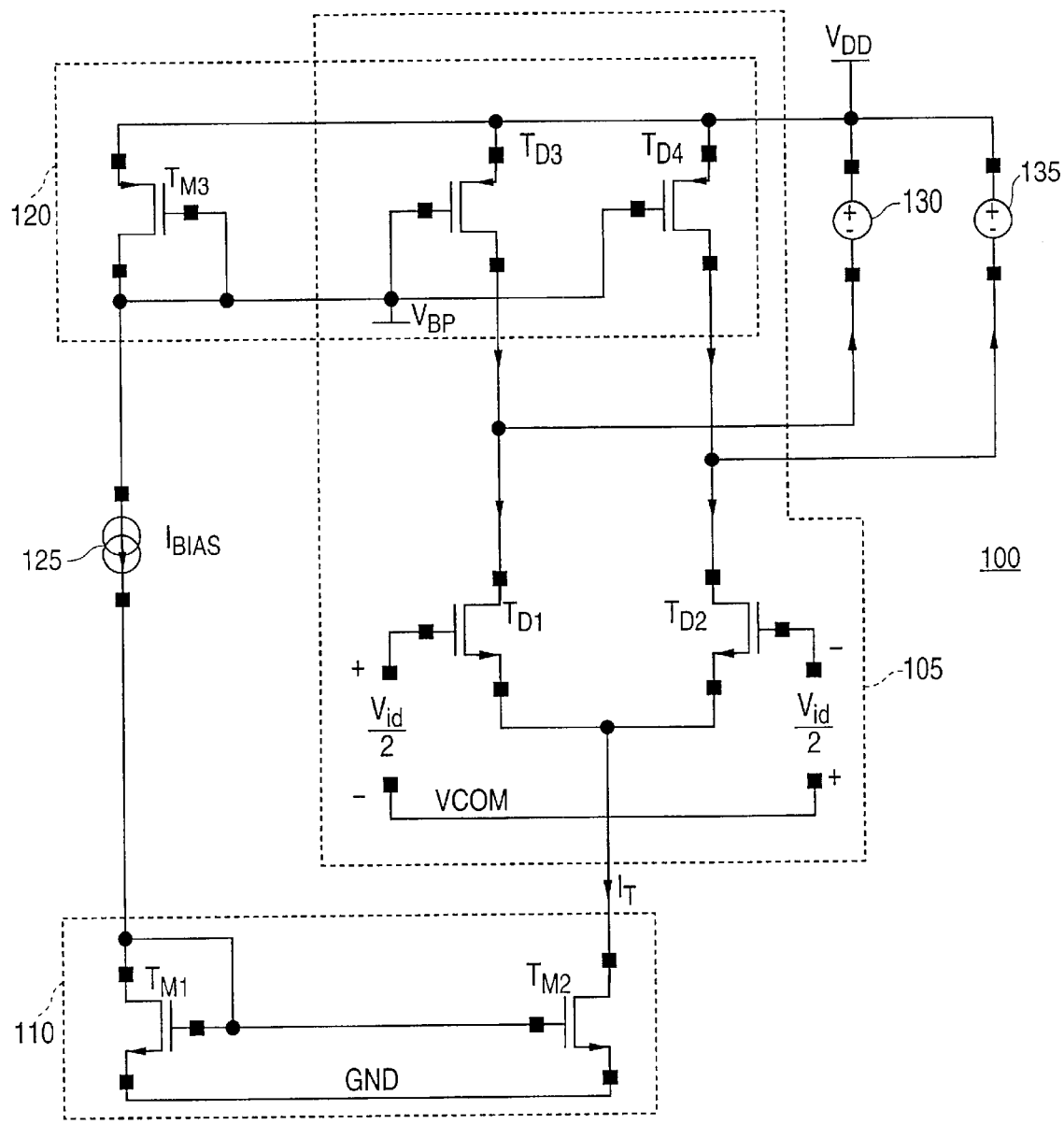
FIG. 1 is a circuit diagram of a conventional elementary differential stage with active load and bias.
Figure 2:
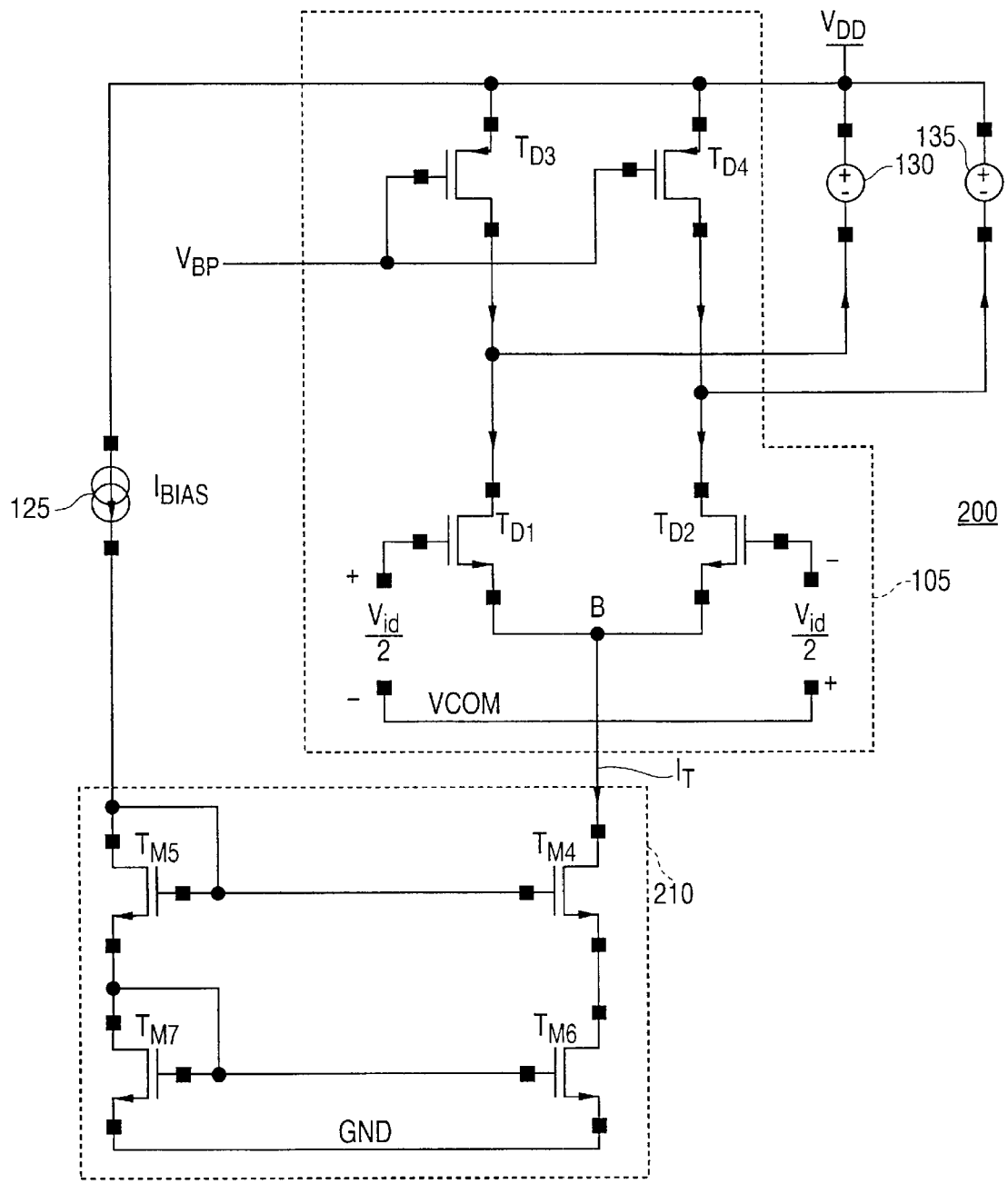
FIG. 2 is a circuit diagram of a conventional elementary differential stage with active load and cascode mirror for the tail-current generator.
Figure 3:
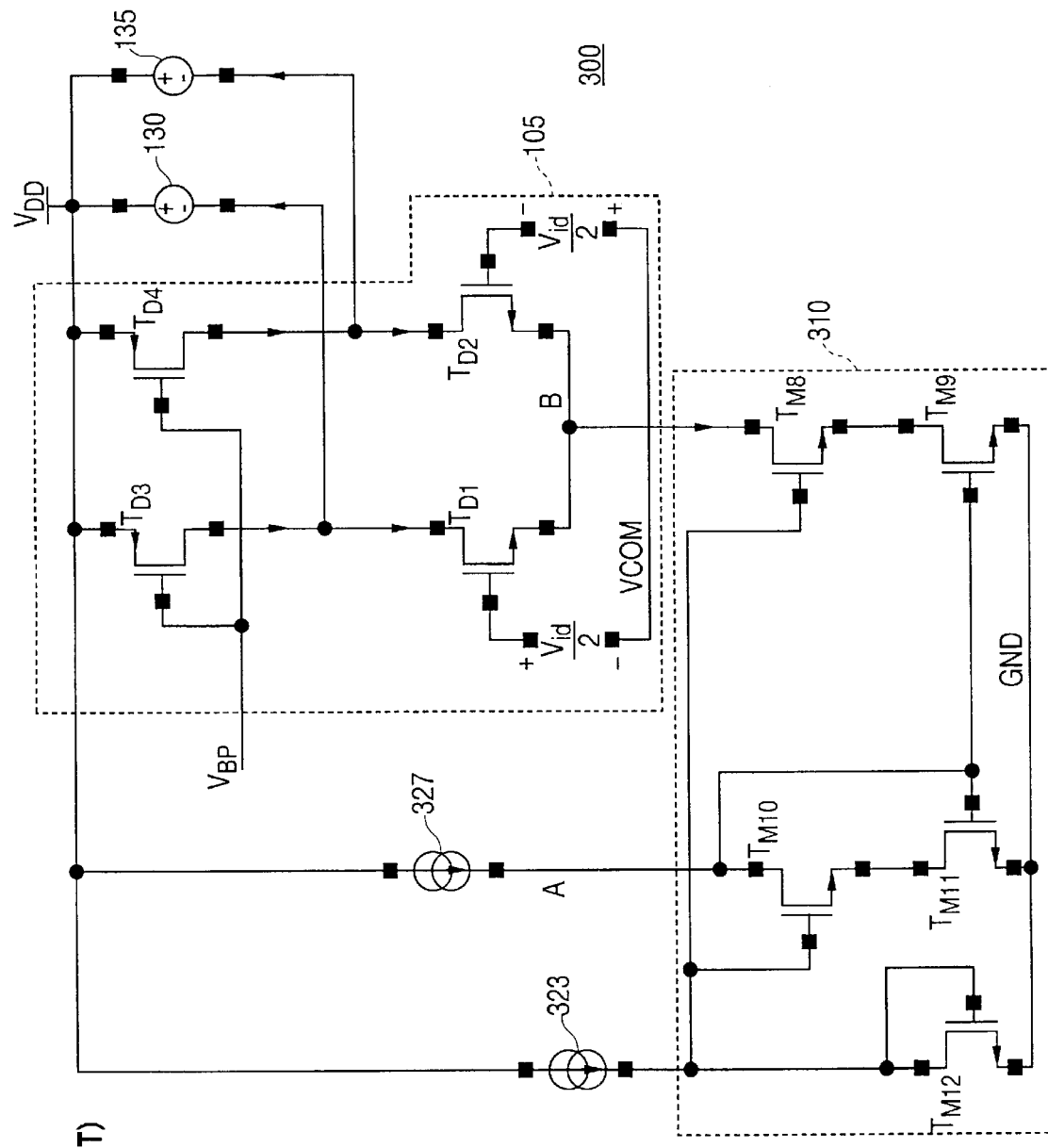
FIG. 3 is a circuit diagram of a conventional elementary differential stage with active load and high-swing cascode mirror for the tail-current generator.
Figure 4:
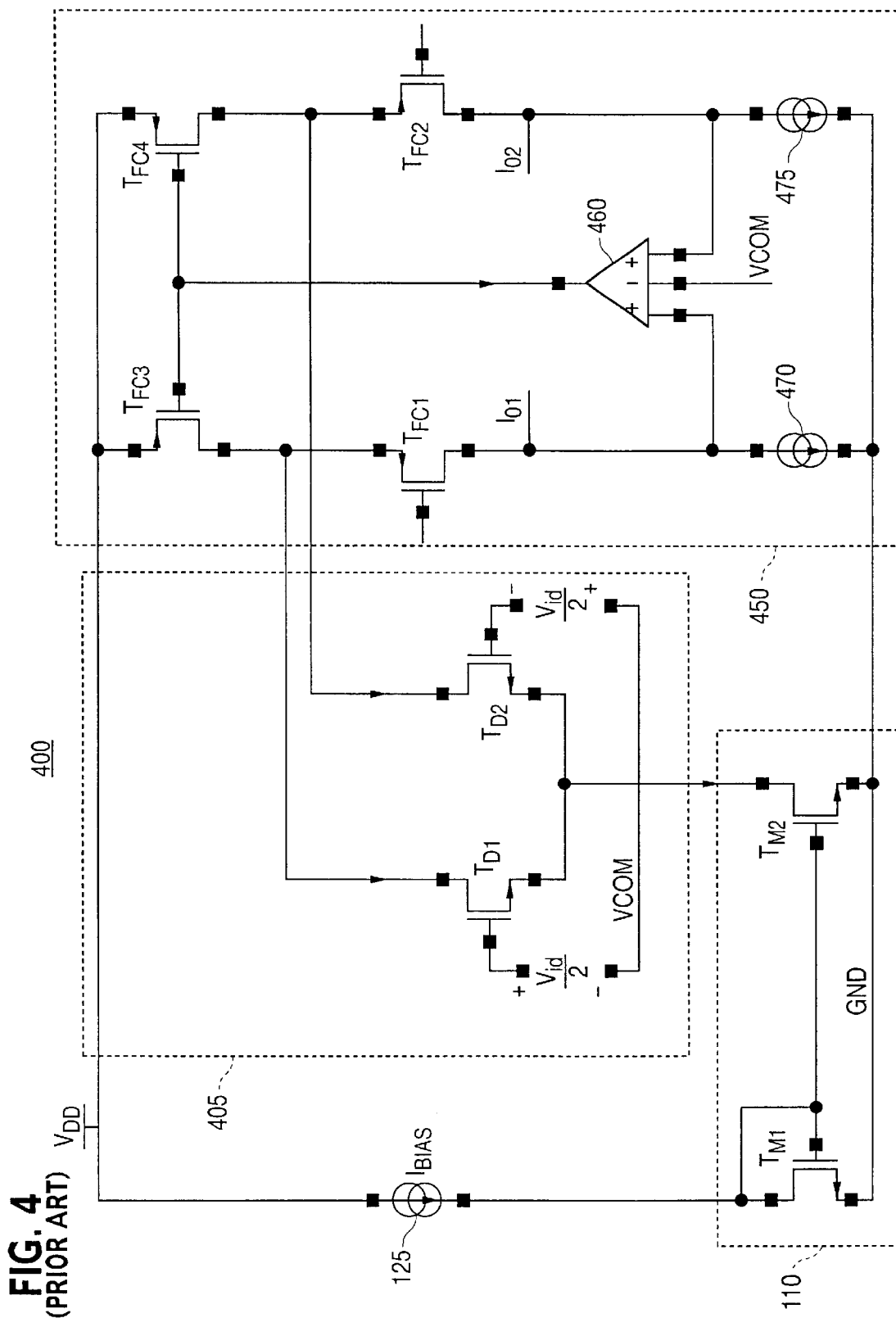
FIG. 4 is a circuit diagram of a conventional folded-cascode differential input-differential output stage with bias.
Figure 5:
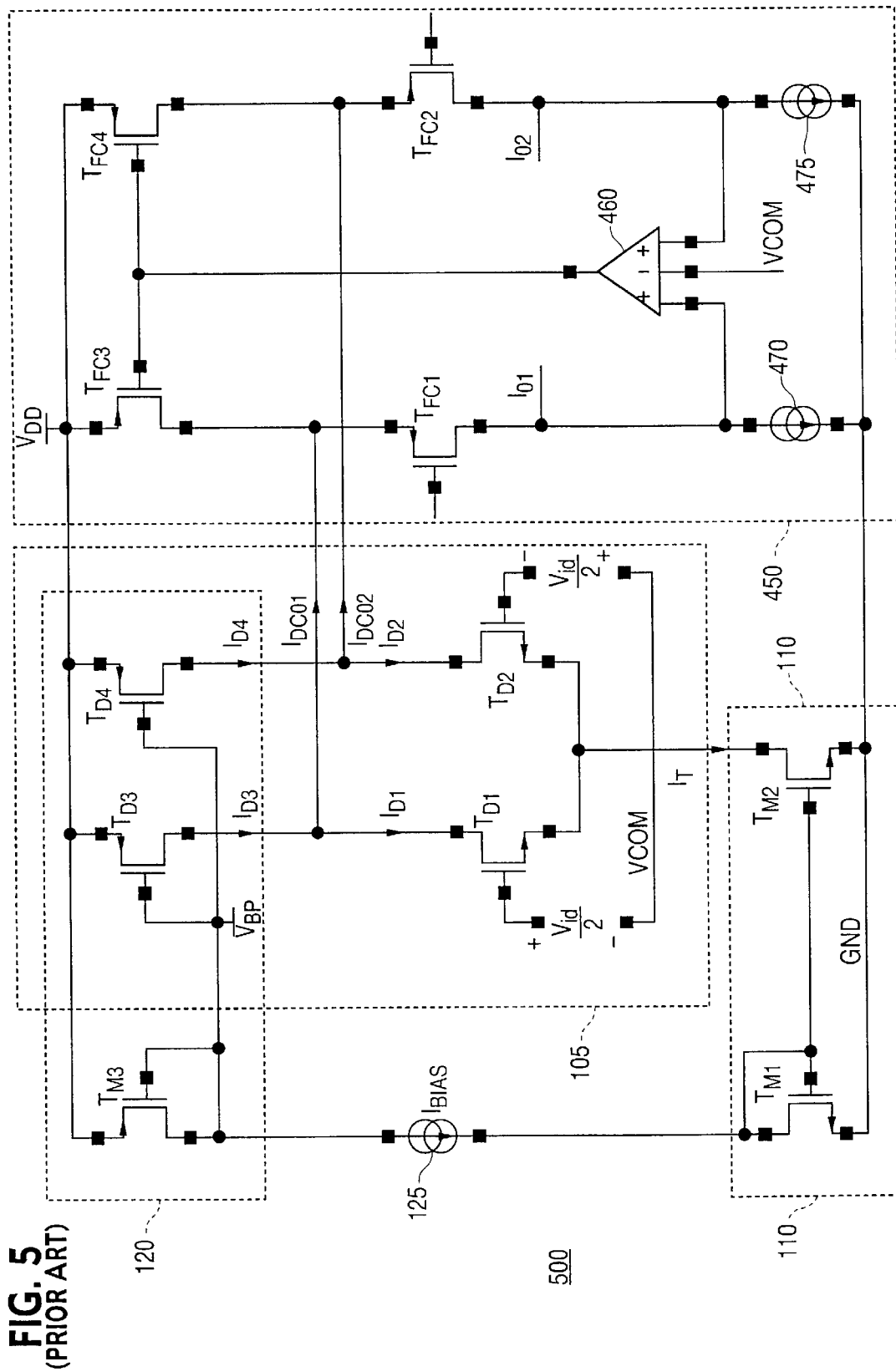
FIG. 5 is a circuit diagram of a conventional differential output folded-cascode with separated loads for the input stage.
Figure 6:
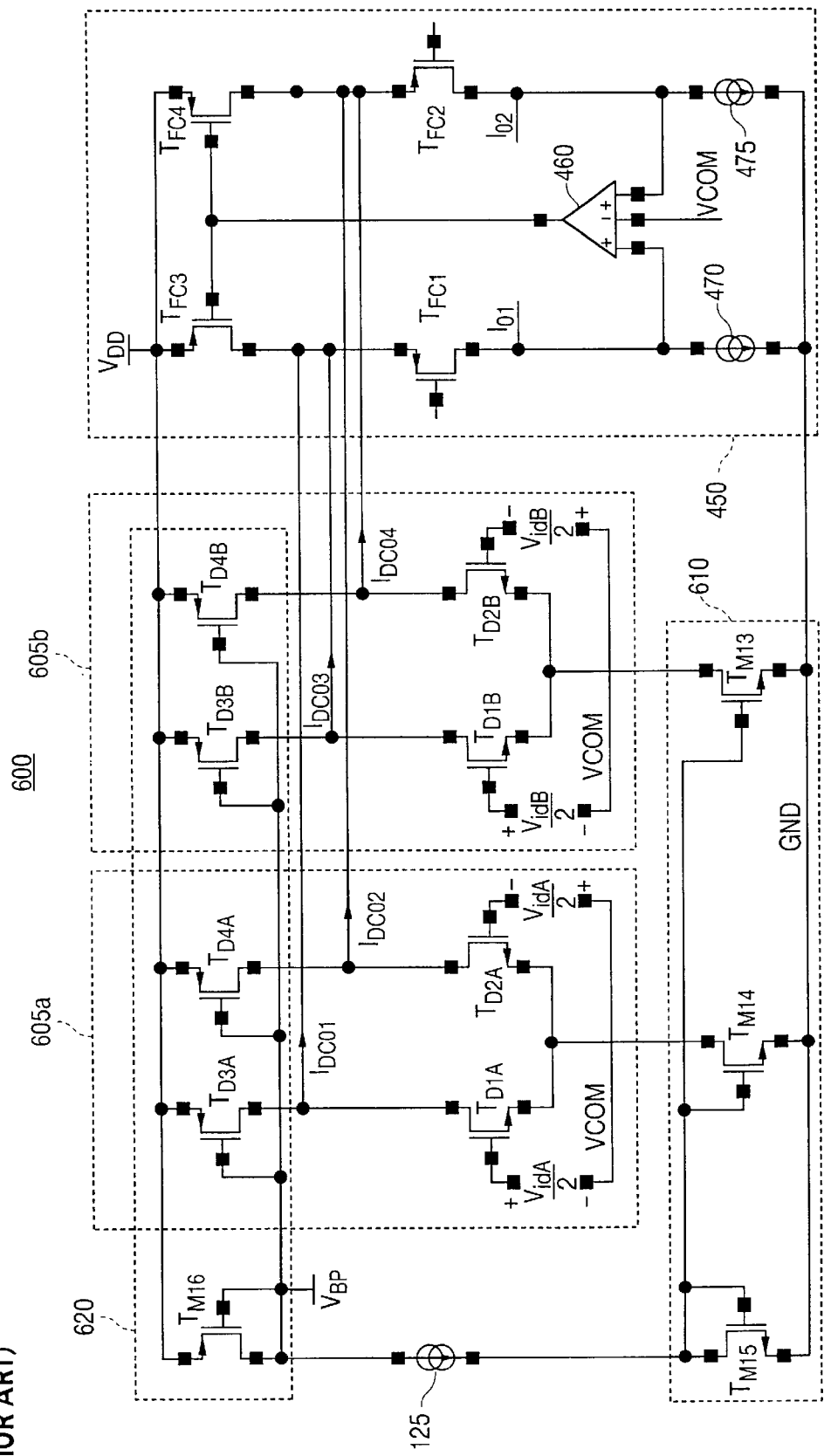
FIG. 6 is a circuit diagram of a conventional two-input stage differential output folded-cascode with separated loads for the input stages.
Figure 7:
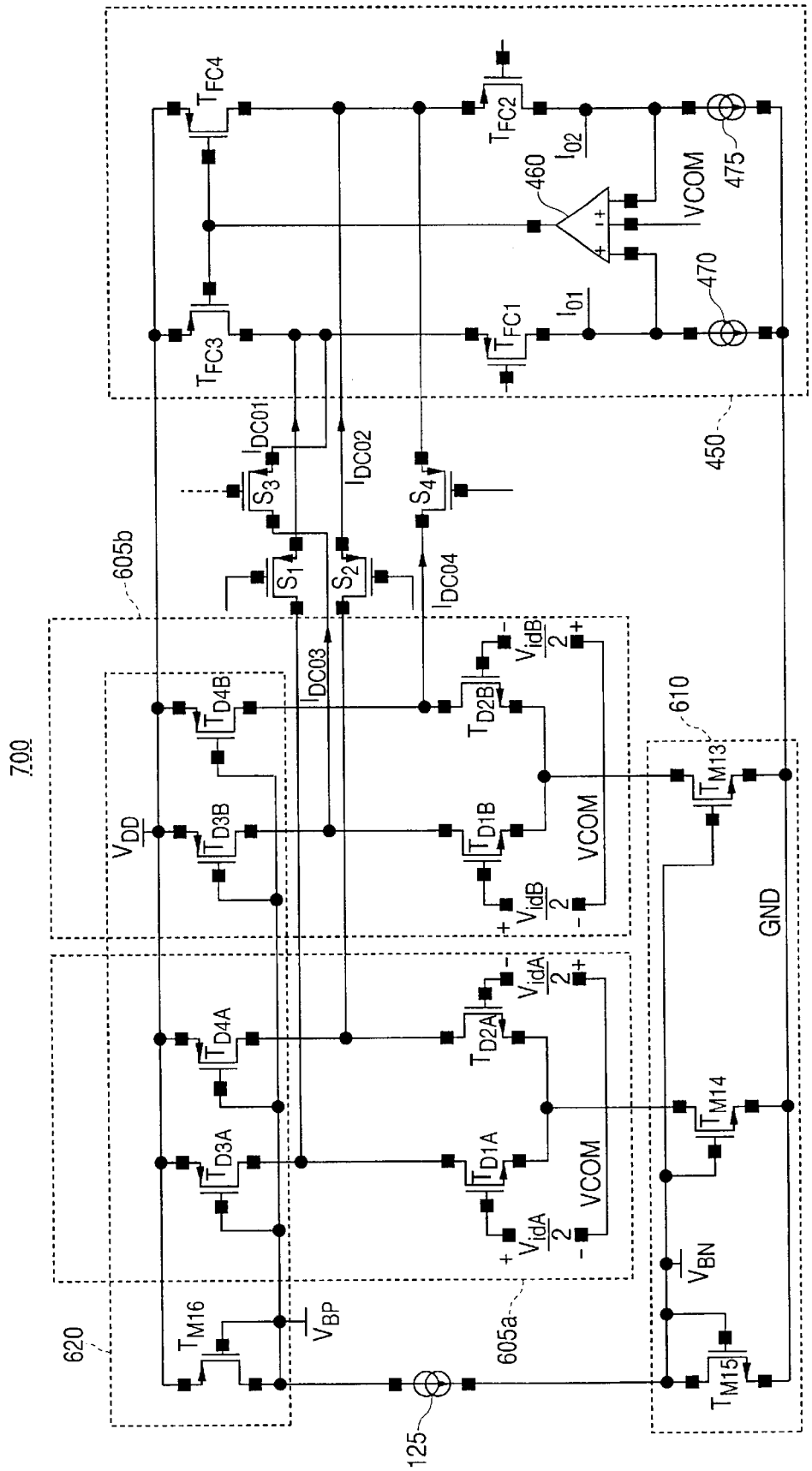
FIG. 7 is a circuit diagram of a conventional switched input stages differential output folded-cascode with separated loads for the input stages.
Figure 8:
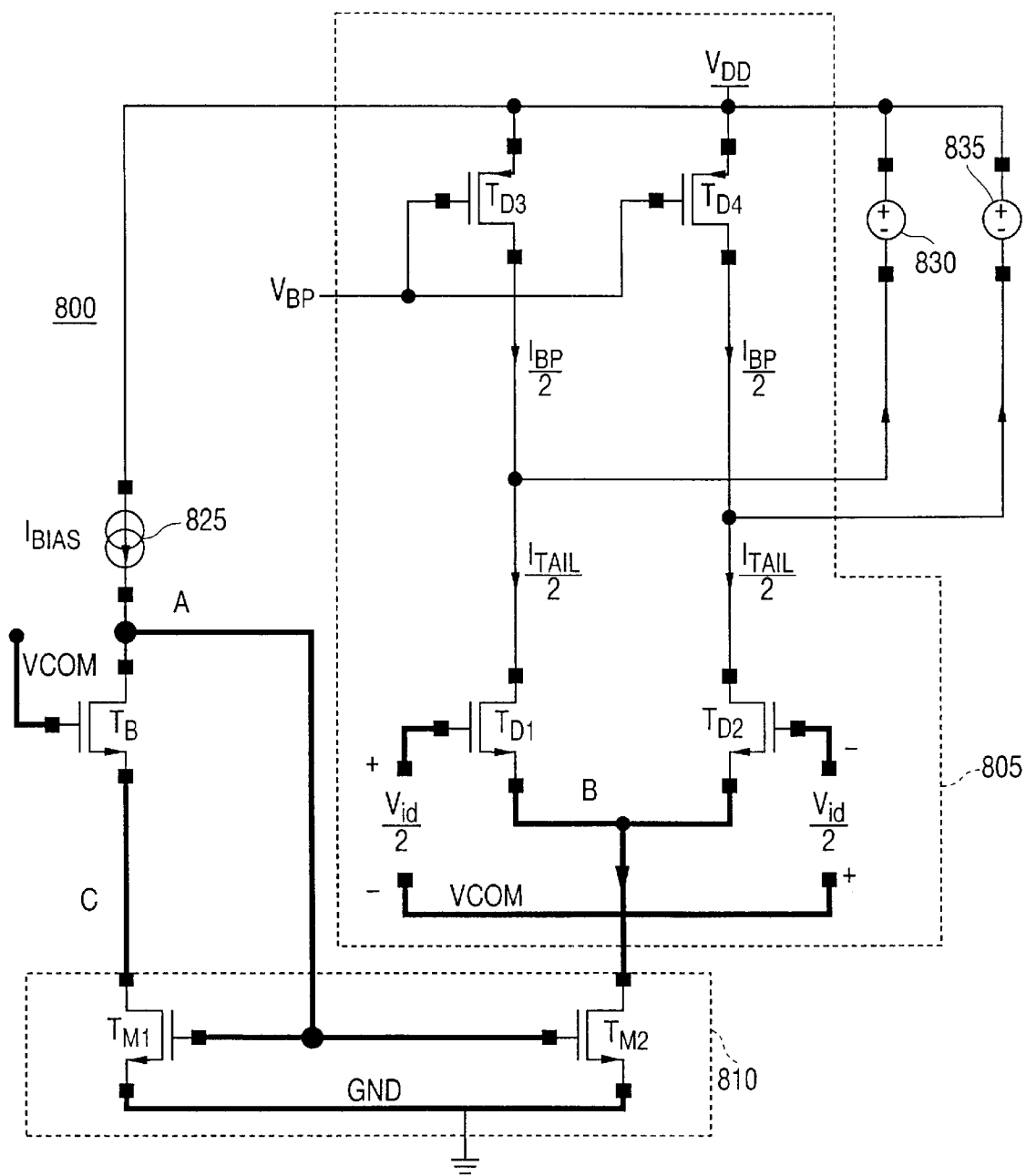
FIG. 8 is a circuit diagram of a high-swing cascode-like current mode bias generator according to a first preferred embodiment of the present invention.

In order to improve the accuracy of the current mirroring at the tail of a differential pair, a high-swing cascode-like current mode bias generator has been designed in accordance with the present invention. FIG. 8 is a circuit diagram of a first preferred embodiment of this invention.

As shown in FIG. 8, the high-swing cascode-like current mode bias generator 800 includes a differential stage 805, a current mirror 810, a bias current source 825, first and second voltage sources 830 and 835, and a bias transistor $T_B$. The differential stage 805 includes first through fourth differential transistors $T_{D1}$, $T_{D2}$, $T_{D3}$, and $T_{D4}$. The current mirror 810 includes first and second mirror transistors $T_{M1}$ and $T_{M2}$.

By properly choosing the dimensions of the transistors $T_{D1}$, $T_{D2}$, $T_B$, $T_{M1}$, and $T_{M2}$, and by biasing the gate of the bias transistor $T_B$ at the input common-mode voltage $V_{COM}$ of the differential pair $T_{D1}$ and $T_{D2}$, the drain voltage of the second mirror transistor $T_{M2}$ will be substantially equal to the drain voltage of the first mirror transistor $T_{M1}$. In this way, the mirror transistors $T_{M1}$ and $T_{M2}$ have the same voltages on corresponding electrodes and so their drain currents relationship is defined only by the geometric dimensions of the two transistors.

For the following calculations a simple square-law model for the MOS transistor will be considered. The limitations imposed by the bias procedure illustrated in the circuit of FIG. 8 will be established. If the bias transistor $T_B$ and the first mirror transistor $T_{M1}$ are saturated, then the following relations will be true.

$$V_{GSB} = V'_{TH} + \sqrt{\frac{2I_{BIAS}}{\beta_B}} = V_{COM} - V_C \quad (8)$$

$$V_{DSB} \geq (V_{GSB} - V_{TH}) \quad (9)$$

$$V_A - V_C \geq (V_{COM} - V_C - V_{TH}) \quad (10)$$

$$V_{GSM1} = V_A = V_{TH} + \sqrt{\frac{2I_{BIAS}}{\beta_{M1}}} \quad (11)$$

$$V_{DSM1} \geq (V_{GSM1} - V_{TH}) \quad (12)$$

$$V_C \geq (V_{A-VTH}) \quad (13)$$

$$\sqrt{\frac{I_{BIAS}}{\beta_B}} \leq V_{TH} \quad (14)$$

where $V_{GSB}$ is the gate-to-source voltage for the bias transistor $T_B$, $V_{DSB}$ is the drain-to-source voltage for the bias transistor $T_B$, $V_{GSM1}$ is the gate-to-source voltage for the first mirror transistor $T_{M1}$, $V_{DSM1}$ is the drain-to-source voltage for the first mirror transistor $T_{M1}$, $V_{TH}$ is the threshold voltage of $T_{M1}$ and $T_{M2}$, $V'_{TH}$ is the threshold voltage of the bias transistor $T_B$ and also of the differential pair transistors $T_{D1}$ and $T_{D2}$, $\beta_B$ is the gain factor of the bias transistor $T_B$, $\beta_{M1}$ is the gain factor of the first mirror transistor $T_{M1}$, $\beta_{D1}$ is the gain factor of the first differential transistor $T_{D1}$, $I_{BIAS}$ is the bias current, $I_T$ is the tail current, $V_A$ is the voltage at the node A, $V_C$ is the voltage at node C, and $V_{COM}$ is the input common node voltage of the differential pair $T_{D1}$ and $T_{D2}$, also connected to the gate of the bias transistor $T_B$.

In these equations, $V'_{TH}$ is different of $V_{TH}$ because of the body effect. The source and the bulk potential are different for the transistors $T_B$, $T_{D1}$, and $T_{D2}$.

The bias current $I_{BIAS}$ is mirrored by the combination of the second mirror transistor $T_{M2}$ and the first and second differential transistors $T_{D1}$ and $T_{D2}$ as the tail current $I_T$, such that $$I_T = n \cdot I_{BIAS} \quad (15)$$

where n represents the same geometric relationship between $T_{M1}$ and $T_{M2}$ shown in equation (2).

The sizes of the bias transistor $T_B$, the first and second mirror transistors $T_{M1}$ and $T_{M2}$, and the first and second differential transistors $T_{D1}$ and $T_{D2}$ are preferably chosen such that $$V_C = V_B \quad (16)$$

where $V_B$ is the voltage at the node B.

This way, the drain voltages of the first and second mirror transistors $T_{M1}$ and $T_{M2}$ are identical so the first and second mirror transistors $T_{M1}$ and $T_{M2}$ will be identically biased. Furthermore, we can see from equation (2) that $$\frac{W_{M2}}{L_{M2}} = 2 \cdot n \cdot \left(\frac{W_{M1}}{L_{M1}}\right). \quad (17)$$

We also know that the drain current $I_{DM2}$ of the second mirror transistor $T_{M2}$ is as follows $$I_{DM2}=2 \cdot n \cdot I_{DM1} \quad (18)$$

$$I_T/2 = n \cdot I_{BIAS} \quad (19)$$

However, having the gate of the bias transistor $T_B$ tied to $V_{COM}$ imposes certain limitations on the sizes of the bias transistor $T_B$, the first and second differential transistors $T_{D1}$ and $T_{D2}$, and the first and second mirror transistors $T_{M1}$ and $T_{M2}$. In particular, it is necessary that $$\sqrt{\frac{I_T}{\beta_{DI}}} \leq V'_{TH} \quad (20)$$

The level of distortions, i.e. the total harmonic distortions (THD), generated by the differential pair $T_{D1}$ and $T_{D2}$ is related to the size of the first and second differential transistors $T_{D1}$ and $T_{D2}$ (where $\beta_{D1}=\beta_{D2}$) as well as to the tail current $I_T$ and to the amplitude $V_{IN-DIF}$ of the differential input voltage $V_{IN-DIF}$ $$\sqrt{\frac{I_T}{\beta_{DI}}} = \frac{V_{IN-DIF}}{\sqrt{32THD}} \quad (21)$$

From equations (14), (20), and (21) it is clear that there are certain limitations for the distortion level to be obtained with this design.

$$V_{GSB}=V_{GSD1} \leq V_{TH}+V'_{TH} \quad (22)$$

As shown in equation (22), the dynamic range of the differential stage is limited by the technology and not by the dimensions of the transistors.

$$V_{DSM1}=V_{DSM2} \geq V_{COM}-(V_{TH}+V'_{TH}) \quad (23)$$

As shown in equation (23), the minimum voltage of the tail point B is also limited by both the choice of technology and the choice of $V_{COM}$. Thus, there are severe limitations, mainly in the dynamic range of the circuit, which depend on technology and general bias conditions (as the common-mode voltage $V_{COM}$). These limitations cannot be overcome by changing the dimensions of the transistors.

However, in alternate embodiments, it is not mandatory that the conditions of equations (11), (12), and (13) hold. The current mirroring works also for the first and second mirror transistors $T_{M1}$ and $T_{M2}$ in the triode region. In other words, even if these equations have been developed for saturated transistors $T_{M1}$ and $T_{M2}$, the accuracy of the current mirroring still holds for $T_{M1}$ and $T_{M2}$ in the triode region.

Figure 9:
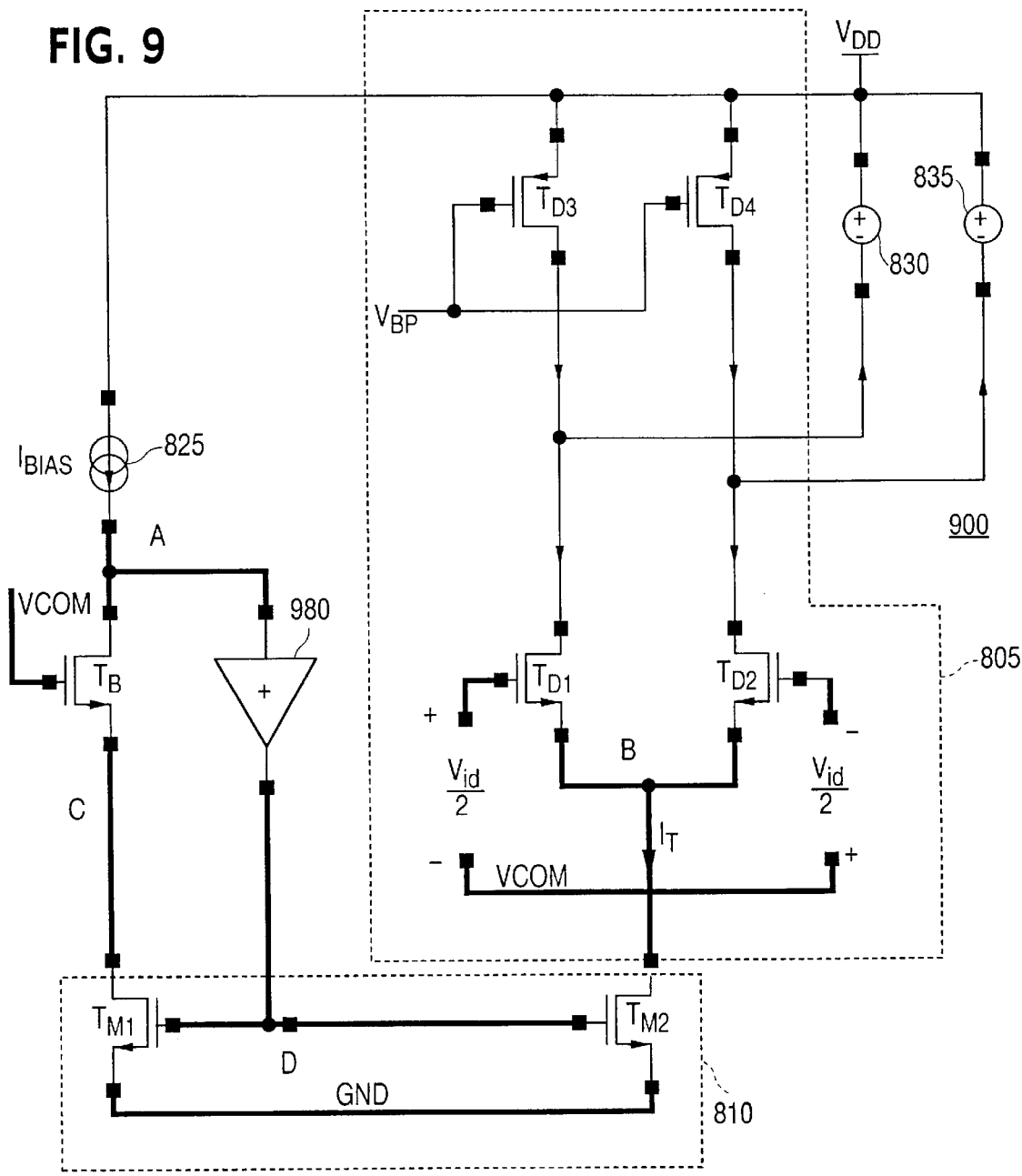
FIG. 9 is a circuit diagram of a high-swing cascode mirror with level shifter tail-current generator according to a second preferred embodiment of the present invention.

A further improvement of the desired bias circuit is presented in FIG. 9, which is a circuit diagram of a high-swing cascode mirror with a level shifter tail-current generator according to a second preferred embodiment of the present invention. As shown in FIG. 9, the circuit 900 includes a differential stage 805, a current mirror 810, a bias current source 825, first and second voltage sources 830 and 835, a bias transistor $T_B$, and a voltage shifter 980. The voltage shifter 980 is a non-inverting amplifier.

In order to relax the dimension restrictions on the transistors $T_B$, $T_{D1}$, $T_{D2}$, $T_{M1}$ and $T_{M2}$, the voltage shifter 980 is introduced between the drain of the bias transistor $T_B$ (i.e., the input for the bias current) and the gates of the first and second mirror transistors $T_{M1}$ and $T_{M2}$. The drain voltage of the bias transistor $T_B$ can exceed the voltage $V_D$ at node D (connected to the gates of the first and second mirror transistors $T_{M1}$ and $T_{M2}$), and so the gate voltage of the first mirror transistor $T_{M1}$ is reduced and the limitations imposed by equation (11) are relaxed. In other words, $$V_{GSM1} \neq V_A \quad (24)$$

One more benefit of introducing the voltage shifter 980 is the possibility of establishing the same drain-source voltage for the first and second differential transistors $T_{D1}$ and $T_{D2}$ as for the bias transistor $T_B$, further improving the current replication accuracy.

Figure 10:
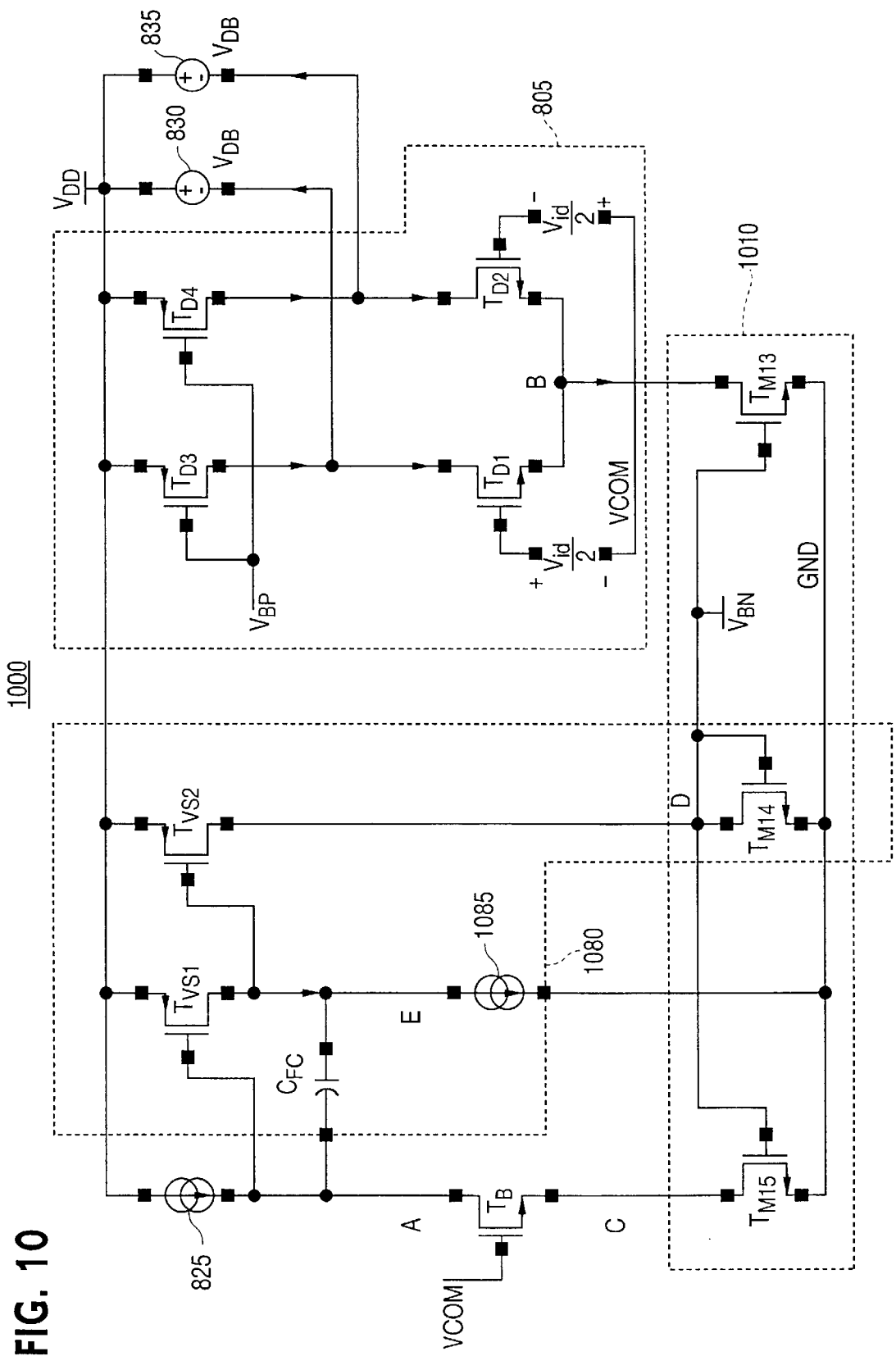
FIG. 10 is a circuit diagram of a high-swing cascode mirror with level shifter tail-current generator according to a third preferred embodiment of the present invention, showing an alternate implementation for the level shifter.

Another implementation of the desired bias circuit is presented in FIG. 10, which is a circuit diagram of high-swing cascode mirror with level shifter tail-current generator according to a third preferred embodiment of the present invention, showing an alternate implementation for the level shifter. As shown in FIG. 10, the circuit 1000 includes a differential stage 805, a current mirror 1010, a bias current source 825, first and second voltage sources 830 and 835, a bias transistor $T_B$, and a voltage shifter 1080. The current mirror 1010 includes thirteenth through fifteenth mirror transistors $T_{M13}$, $T_{14}$, and $T_{M15}$. The voltage shifter 1080 preferably comprises first and second voltage shifter transistors $T_{VS1}$ and $T_{VS2}$, a voltage shifter current source 1085, a load transistor $T_{M14}$, and a frequency compensation capacitor $C_{FC}$.

The voltage $V_D$ at node D, i.e., the output voltage of the voltage shifter 1080 controls the currents through the thirteenth and fifteenth mirror transistors $T_{13}$ and $T_{M15}$. The first voltage shifter transistor $T_{VS1}$ is biased by the voltage shifter current source 1085 so as to have a source-gate voltage equal to the voltage $V_{DB}$ supplied by the first and second voltage sources 830 and 835. This way, the corresponding voltages on the drain electrodes of the transistors $T_B$, $T_{D1}$, and $T_{D2}$ are identical. Transistors $T_B$, $T_{D1}$, $T_{D2}$, $T_{M15}$, and $T_{M13}$ thus form a high-swing cascode current mirror.

The drain voltage of the thirteenth mirror transistor $T_{M13}$ is now identical with the drain voltage of the fifteenth mirror transistor $T_{M13}$ and so the two transistors can even enter the triode region without affecting the accuracy of the current mirroring. The minimum tail voltage $V_{B-MIN}$, i.e., the minimum voltage at the node B, for the first and second mirror transistors $T_{M1}$ and $T_{M2}$ to be saturated is now $$V_{B-MIN}=\Delta V \quad (25)$$

where $\Delta V$ is determined as set forth in equation (4).

Furthermore, if the differential stage tolerates the low impedance presented by the thirteenth mirror transistor $T_{M13}$ in the triode region, then the voltage at node B can go even lower.

The first through third embodiments of the present invention improve the current replication by establishing substantially equal voltages across transistors involved in current mirroring, i.e., they establish substantially equal voltages at the nodes B and C. The resulting configurations are appropriate for low-voltage operation.

Figure 11:
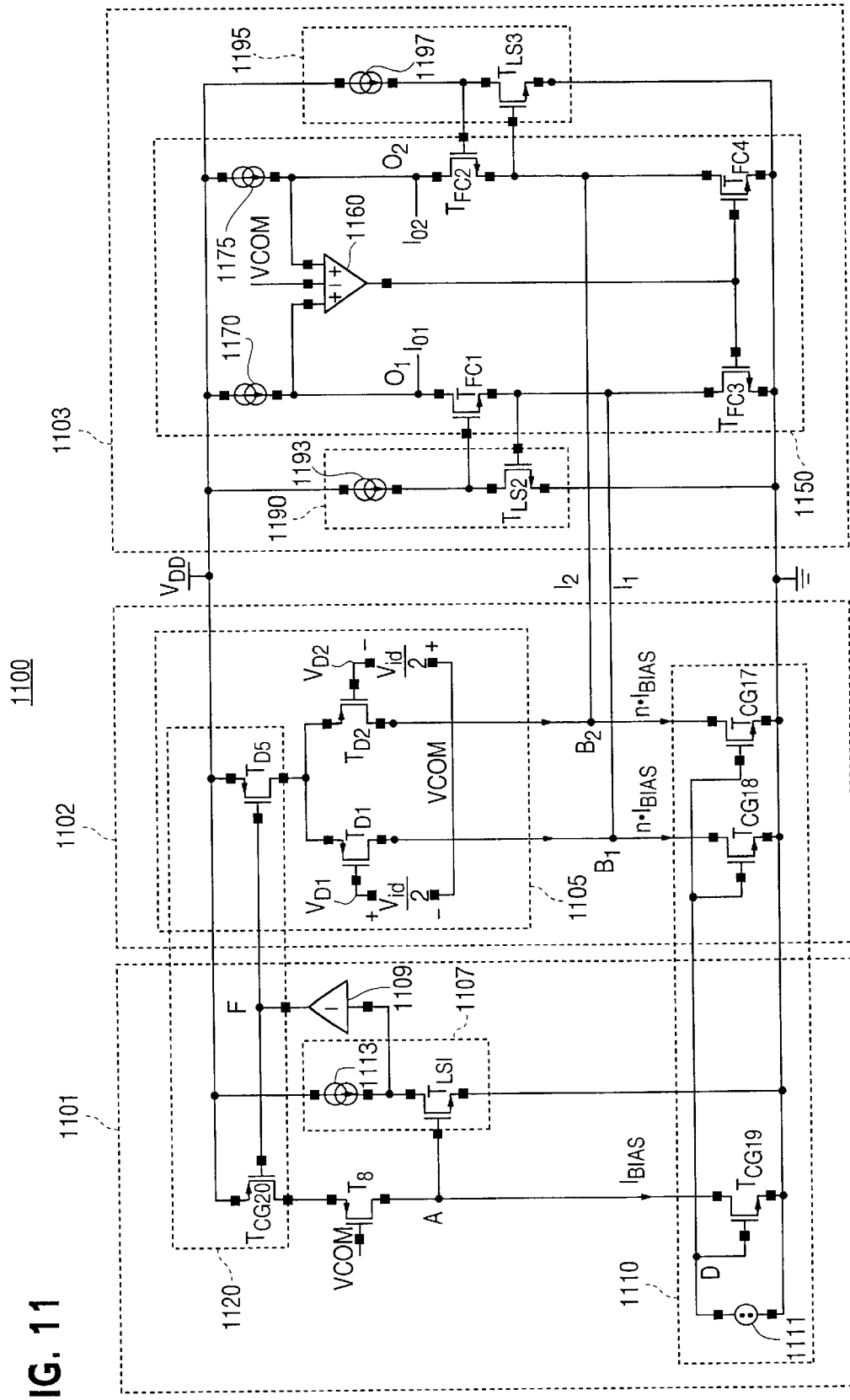
FIG. 11 is a circuit diagram of a precision bias for a transconductor according to a fourth preferred embodiment of the present invention in a voltage control mode.

FIG. 11 is a circuit diagram of precision bias for a transconductor according to a fourth preferred embodiment of the current invention in a voltage control mode. The bias current is the result of a local voltage-to-current conversion of a bias voltage. As shown in FIG. 11, the circuit 1100 includes a bias circuit 1101, an input stage 1102, and an output stage 1103. Lower current source 1110 and upper current source 1120 are formed between the bias circuit 101 and the input stage 1102.

The bias circuit 1101 includes nineteenth and twentieth current generating transistors $T_{CG19}$ and $T_{CG20}$, a bias transistor $T_B$, a first level-setting amplifier 1107, and an inverting amplifier 1109. The first level-setting amplifier 1107 includes a first level-setting current source 1113 and a first level-setting transistor $T_{LS1}$.

The input stage 1102 includes seventeenth and eighteenth current generating transistors $T_{CG17}$ and $T_{CG18}$, first, second, and fifth differential transistors $T_{D1}$, $T_{D2}$, and $T_{D5}$. The first, second, and fifth differential transistors $T_{D1}$, $T_{D2}$, and $T_{D5}$ together form a differential stage 1105.

The lower current generator 1110 includes the seventeenth through nineteenth current generating transistors $T_{CG17}$ to $T_{CG19}$, and a fifth voltage source 1111. The upper current generator 1120 includes the twentieth current generating transistor $T_{CG20}$ and the fifth transistor $T_{D5}$.

The output stage 1103 includes second and third level-setting amplifiers 1190 and 1195, and a folded-cascode 1150. The second level-setting amplifier 1190 includes a second level-setting current source 1193 and a second level-setting transistor $T_{LS2}$. The third level-setting amplifier 1195 includes a third level-setting current source 1197 and a third level-setting transistor $T_{LS3}$. The folded-cascode 1150 includes first through fourth folded-cascode transistors $T_{FC1}$ to $T_{FC4}$, a voltage amplifier 1160, and first and second current sources 1170 and 1175, and provides first and second output currents $I_{O1}$ and $I_{O2}$. The voltage amplifier 1160 works as a common-mode setting amplifier.

The inputs of the first and second differential transistors $T_{D1}$ and $T_{D2}$ are the first and second input voltages $v_{id}/2$ and $-v_{id}/2$ (calculated with respect to $V_{COM}$), respectively. The fifth voltage source 1111 provides the bias voltage $V_{DB}$ at the node D. The bias voltage $V_{DB}$ allows the nineteenth mirror transistor $T_{CG19}$ to generate the bias current $I_{BIAS}$.

A differential input voltage ($v_{id}=[v_{id}/2-(-v_{id}/2)]$, determined by subtracting the second input voltage from the first input voltage, is converted to a differential current by the differential pair $T_{D1}$ and $T_{D2}$. The current difference is transmitted to the outputs $O_1$ and $O_2$ by a folded-cascode 1150. The common-mode output voltage is sensed by the amplifier 1160, which is part of a feedback loop that regulates the gate voltage of the third and fourth folded-cascode transistors $T_{FC3}$ and $T_{FC4}$.

The transistors in the bias chain $T_{CG19}$, $T_{CG20}$, and $T_B$ are respectively matched to those in the differential stage such that $$\frac{W_{CG17}}{L_{CG17}} = \frac{W_{CG18}}{L_{CG18}} = n \cdot \frac{W_{CG19}}{L_{CG19}}, \quad (26)$$

$$\frac{W_{D1}}{L_{D1}} = \frac{W_{D2}}{L_{D2}} = n \cdot \frac{W_B}{L_B}, \text{ and} \quad (27)$$

$$\frac{W_{D5}}{L_{D5}} = 2n \cdot \frac{W_{CG20}}{L_{CG20}}, \quad (28)$$

where $W_{D1}$, $W_{D2}$, $W_{D5}$, $W_{CG17}$, $W_{CG18}$, $W_{CG19}$, $W_{CG20}$, and $W_B$, and $L_{D1}$, $L_{D2}$, $L_{D5}$, $L_{CG17}$, $L_{CG18}$, $L_{CG19}$, $L_{CG20}$, and $L_B$, are the widths and lengths, respectively, of the transistors $T_{D1}$, $T_{D2}$, $T_{D5}$, $T_{CG17}$, $T_{CG18}$, $T_{CG19}$, $T_{CG20}$, and $T_B$.

The back gates of the corresponding transistors are similarly tied to the respective substrates or to the respective transistors sources. The voltage on the gate of the bias transistor $T_B$ is the same as the common-mode input voltage of the differential pair $T_{D1}$-$T_{D2}$.

As a result of this design, the DC currents through transistors $T_{D1}$, $T_{D2}$, $T_{CG17}$, and $T_{CG18}$ are n times larger than the currents through the transistors $T_B$ and $T_{CG19}$, respectively.

In order to assure the accuracy of the generated current, the drain-source voltages of the corresponding transistors must be matched. The drain-source voltages of the transistors $T_{CG17}$ and $T_{CG18}$ (at nodes $B_1$ and $B_2$, respectively) are established by the second and third level-setting amplifiers 1190 and 1195, respectively, according to the following equations.

$$V_{DS-M18}=V_{GS-LS2}, \quad (29)$$

and $$V_{DS-M17}=V_{GS-LS3}, \quad (30)$$

where $V_{DS1-M17}$ is the drain-to-source voltage of the seventeenth current generating transistor $T_{CG17}$, $V_{GS-LS2}$ is the gate-to-source voltage of the second level-setting transistor $T_{LS2}$, $V_{DS-M18}$ is the drain-to-source voltage of the eighteenth current generating transistor $T_{CG18}$, and $V_{GS-LS3}$ is the gate-to-source voltage of the third level-setting transistor $T_{LS3}$.

Because the drain currents and the sizes of the first through third level-setting transistors $T_{LS1}$ to $T_{LS3}$ are equally ratioed, their gate-source voltages are equal. As a result, the feedback loop $T_{LS1}$-1113-1109-$T_{CG20}$-$T_B$ sets the voltage $V_F$ at node F, i.e., the upper current generator voltage, to cause the same drain-source voltage for the nineteenth current generating transistor $T_{CG19}$ as for the seventeenth and eighteenth current generating transistors $T_{CG17}$ and $T_{CG18}$. In other words, $$V_A V_{B1}=hd\ B2, \quad (31)$$

where $V_A$ is the voltage at node A, $V_{B1}$ is the voltage at node $B_1$, and $V_{B2}$ is the voltage at node $B_2$.

As a consequence of this, the correspondent transistors of the bias chain and of the input stage are identically biased independent of the magnitude of the bias current in a domain that keeps the transistors functioning. This way, if the bias current determined by $V_D$ is $I_{BIAS}$, the magnitude of the DC drain current of the transistors $T_{CG17}$, $T_{CG18}$, $T_{D1}$, and $T_{D2}$ will be $n \cdot I_{BIAS}$ and for a zero differential input voltage ($V_{D1}=V_{D2}=V_{COM}$), output currents $I_1$ and $I_2$ from the first stage are both zero.

$$I_1=I_2=0 \quad (32)$$

Because the folded-cascode stage processes only incremental currents coming from the differential input stages, the change in bias of the first stage is not reflected in a change of bias (through the common-mode feedback loop) of the folded-cascode. This way the folded cascode stage can have a fixed bias independent of the possibly-variable bias of the input transconductor 1102.

Figure 12:
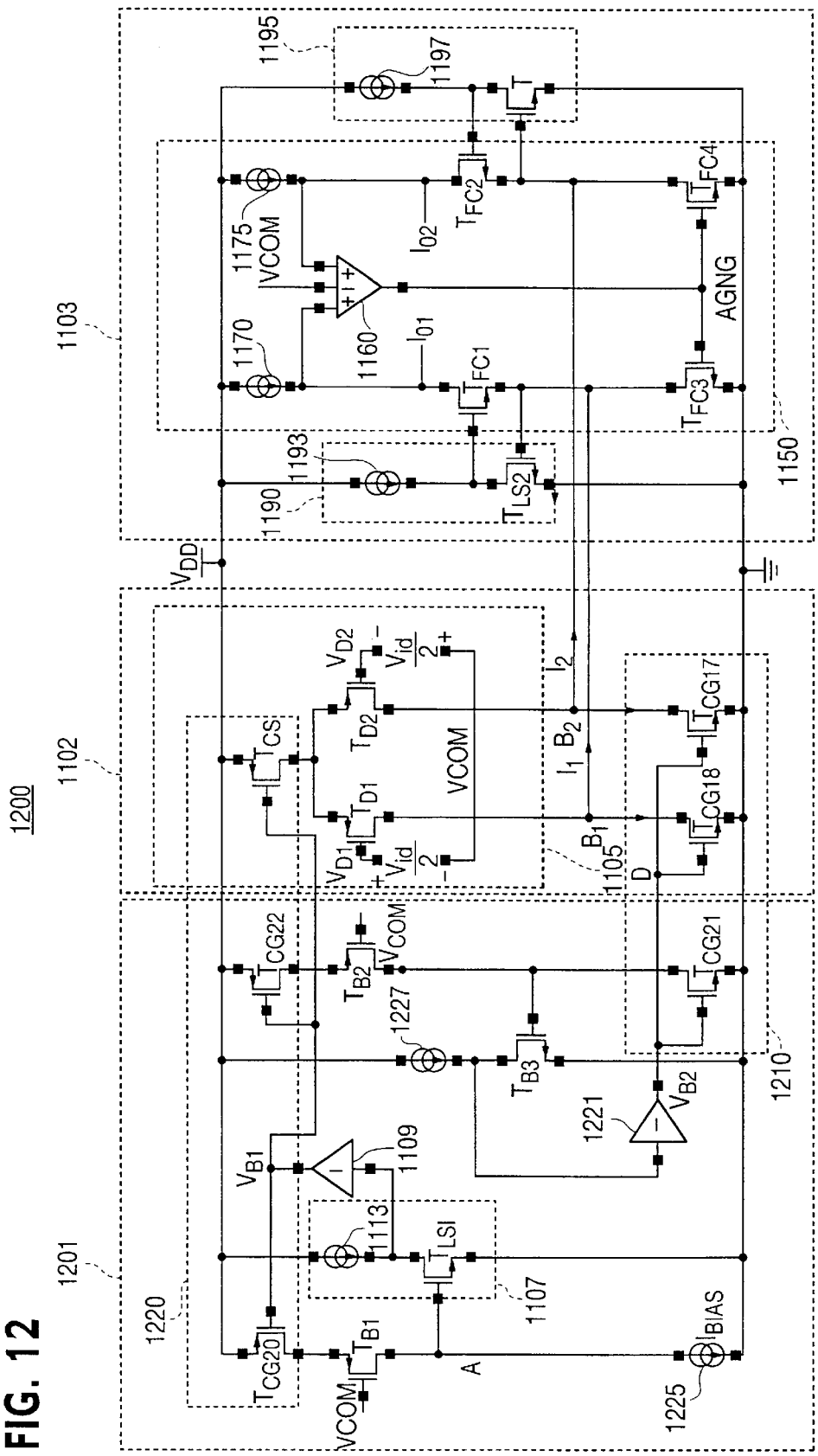
FIG. 12 is a circuit diagram of a precision bias for a transconductor according to a fifth preferred embodiment of the present invention in a current control mode.

FIG. 12 is a circuit diagram of a precision bias for a transconductor according to a fifth preferred embodiment of the present invention in a current control mode. As shown in FIG. 12, the precision bias 1200 includes a bias circuit 1201, an input stage 1102, and an output stage 1103. Lower and upper current generators 1210 and 1220 are formed between the bias circuit 1201 and the input stage 1102.

The bias circuit 1201 includes the twentieth through twenty-second current generating transistors $T_{CG20}$ through $T_{CG22}$, first through third bias transistors $T_{B1}$ to $T_{B3}$, a first level-setting amplifier 1107, an inverting amplifier 1109, an inverting amplifier 1221, and first and second bias current sources 1225 and 1227. The first level-setting amplifier 1107 includes a first level-setting current source 1113 and a first level-setting transistor $T_{LS1}$.

The lower current generator 1210 includes seventeenth, eighteenth, and twenty-first current generating transistors $T_{CG17}$, $T_{CG18}$, and $T_{CG21}$. The upper current generator 1220 includes twentieth and twenty-second current generating transistors $T_{CG20}$ and $T_{CG22}$, and the current source transistor $T_{CS}$.

FIG. 12 shows a similar way of establishing the bias voltages $V_{B1}$ and $V_{B2}$ starting from the bias current $I_{BIAS}$. As shown in FIG. 12, the current $I_{BIAS}$ is injected into the bias chain $T_{B1}$ and $T_{CG20}$, and is generated via the upper current generator 1220 through the current source transistor $T_{CS}$ into the differential pair $T_{D1}$ and $T_{D2}$. The bias loop including first level-setting amplifier 1107, the inverting amplifier 1109, the twentieth current generating transistor $T_{CG20}$, and the bias transistor $T_{B1}$ establishes the voltage at node A to be equal to that at nodes $B_1$ and $B_2$, as set forth in equation (31).

Another loop, including of the twenty-first and twenty-second current generating transistors $T_{CG21}$ and $T_{CG22}$, and the second and third bias transistors $T_{B2}$ and $T_{B3}$, the second bias current source 1227, and the inverting amplifier 1221, generates the voltage $V_D$ and node D, i.e., the second bias voltage, such that the magnitude of the DC drain current of the seventeenth and eighteenth current generating transistors $T_{CG17}$ and $T_{CG18}$, and the first and second differential transistors $T_{D1}$ and $T_{D2}$ is ($n \cdot I_{BIAS}$) for a zero differential input voltage ($V_{D1}=V_{D2}=V_{COM}$). As a result the output currents from the first stage are:

$$I_1 = I_2 = 0 \tag{33}$$

The feedback loop forces the drain currents of $T_{D1}$ and $T_{D2}$, and $T_{CG17}$ and $T_{CG18}$, respectively, to be equal.

Figure 13:
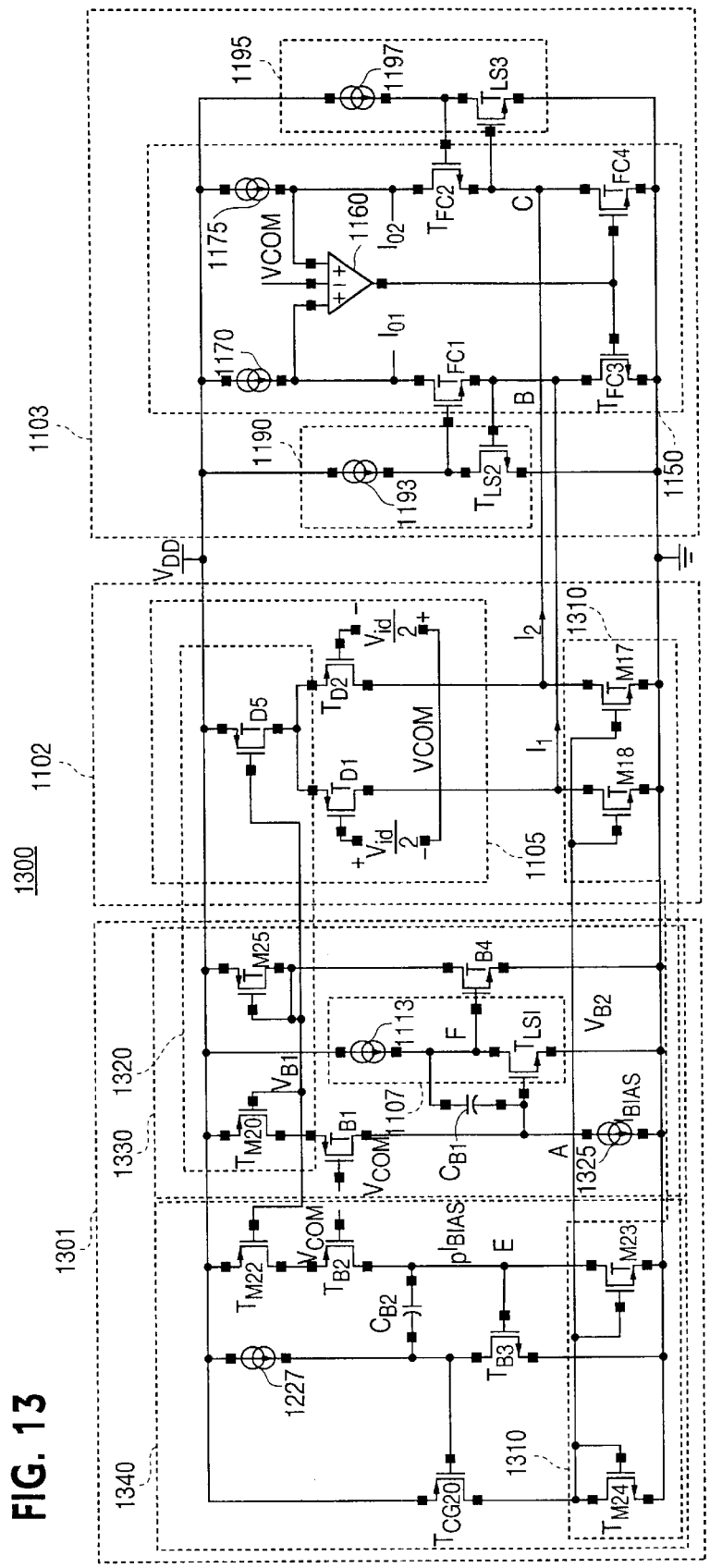
FIG. 13 is a circuit diagram of a precision bias for a transconductor according to a sixth preferred embodiment of the present invention.

FIG. 13 is a circuit diagram of precision bias for a transconductor according to a sixth preferred embodiment of the present invention in a current control mode. In this implementation, the inverting amplifiers shown in FIG. 12 are implemented using more specific circuit elements. As shown in FIG. 13, the precision bias 1300 includes a bias circuit 1301, an input stage 1102, and an output stage 1103.

The bias circuit 1301 includes the twentieth, twenty-second, twenty-fourth, and twenty-fifth mirror transistors $T_{M20}$, $T_{M22}$, $T_{M24}$, and $T_{M25}$, first through fourth and sixth bias transistors $T_{B1}$, $T_{B2}$, $T_{B3}$, $T_{B4}$, and $T_{B6}$, a first level-setting amplifier 1107, first and second frequency compensation capacitors $C_{B1}$ and $C_{B2}$, and first and third bias current sources 1325 and 1227. The first level-setting amplifier 1107 includes a first level-setting current source 1113 and a first level-setting transistor $T_{LS1}$.

The lower current mirror 1310 includes seventeenth, eighteenth, twenty-first, and twenty-fourth mirror transistors $T_{M17}$, $T_{M18}$, $T_{M21}$, and $T_{M24}$. The upper current mirror 1320 includes twentieth and twenty-fifth mirror transistors $T_{M20}$ and $T_{M25}$, and the fifth differential transistor $T_{D5}$.

The bias current for the differential stage 1102 is set by the voltage $V_{B1}$ on the gate of the mirror transistor $T_{D5}$. The voltage $V_{B1}$ is generated by the bias block 1330. The current $I_{BIAS}$ is forced through the transistors $T_{B1}$ and $T_{M20}$ by a first feedback loop consisting of the level-setting inverting amplifier 1107 and the inverting amplifier made out of transistors $T_{B4}$ and $T_{M25}$.

In order to make the drain currents of the transistors $T_{M18}$ and $T_{M17}$ equal to the drain currents of the transistors $T_{D1}$ and $T_{D2}$, respectively, a second bias circuit 1340 sets the voltage $V_{B2}$ on the gates of the mirror transistors $T_{M18}$ and $T_{M17}$. The bias circuit 1340 is a three stage voltage amplifier consisting of an inverting stage made out of the transistor $T_{M21}$ with a current source ($T_{M22}$ and $T_{B2}$) as a load; an inverting stage made out of the transistor $T_{B3}$ with the current source 1227 as load; and an inverting stage made out of $T_{B6}$ with the mirror transistor $T_{M24}$ as load.

The critical transistor dimensions and the critical currents are related as follows.

$$\frac{W_{D5}}{L_{D5}} = 2n \cdot \frac{W_{M20}}{L_{M20}} \tag{34}$$

$$\frac{W_{D1}}{L_{D1}} = \frac{W_{D2}}{L_{D2}} = n \cdot \frac{W_{B1}}{L_{B1}} \tag{35}$$

$$\frac{W_{M22}}{L_{M22}} = p \cdot \frac{W_{M20}}{L_{M20}} \tag{36}$$

$$\frac{W_{B2}}{L_{B2}} = p \cdot \frac{W_{B1}}{L_{B1}} \tag{37}$$

$$\frac{W_{M18}}{L_{M18}} = \frac{W_{M17}}{L_{M17}} = \frac{n}{p} \cdot \frac{W_{M2}}{L_{M2}} \tag{38}$$

$$\frac{W_{LS2}}{L_{LS2}} = \frac{W_{LS3}}{L_{LS3}} = q \cdot \frac{W_{LS1}}{L_{LS1}} \tag{39}$$

$$I_{1193} = I_{1197} = q I_{1113} \tag{40}$$

$$\frac{W_{B3}}{L_{B3}} = r \cdot \frac{W_{LS1}}{L_{LS1}} \tag{41}$$

$$I_{1227} = r I_{1113} \tag{42}$$

The letters p, q, and r represent positive numbers that denote the scale of the transistors $T_{LS1}$, $T_{LS2}$, $T_{LS3}$, and $T_{B3}$. Currents $I_{1193}$, $I_{1197}$, $I_{1113}$, and $I_{1227}$ represent the currents through respective elements 1193, 1197, 1113, and 1227.

Because the drain currents and the aspect ratios of the transistors $T_{B3}$, $T_{LS1}$, $T_{LS2}$, and $T_{LS3}$ are in the same ratio, as shown in equation (43), $$\frac{I_{1227}}{W_{B3}/L_{B3}} = \frac{I_{1113}}{W_{LS1}/L_{LS1}} = \frac{I_{1193}}{W_{LS2}/L_{LS2}} = \frac{I_{1197}}{W_{LS3}/L_{LS3}} \tag{43}$$

the gate-source voltages of the respective transistors are equal:

$$V_E = V_A = V_B = V_C \tag{44}$$

The mirror transistors $T_{D5}$ and $T_{M20}$ have identical voltage across their corresponding electrodes and as such, the ratio of their drain currents is equal to the ratio of their widths over length factors (2n as shown in equation (34)). By choosing the dimensions of the differential pair transistors $T_{D1}$ and $T_{D2}$ to have the same length, but n times the width of $T_{B1}$, the drain currents of $T_{D1}$ and $T_{D2}$ will be n times $I_{BIAS}$.

In order to make the drain currents of the transistors $T_{M17}$ and $T_{M18}$ equal to the same $n \cdot I_{BIAS}$ current, a second bias circuit 1340 sets the voltage $V_{B2}$ on the gate of the mirror transistors $T_{M17}$ and $T_{M18}$. The bias circuit 1340 is a three stage voltage amplifier comprising an inverting stage made out of the transistor $T_{M21}$ with a current source ($T_{M22}$ and $T_{B2}$) as load; an inverting stage made out of the transistor $T_{B3}$ with the current source 1227 as load; and an inverting stage made out of $T_{B6}$ with the mirror transistor $T_{M24}$ as load. The feedback loop of the second bias circuit 1340 establishes such a gate-source voltage for the transistor $T_{M21}$ as to have the drain current equal to $p \cdot I_{BIAS}$.

The transistors $T_{M17}$, $T_{M18}$, and $T_{M21}$ have the same voltages on their corresponding electrodes. As a result, their drain currents will be as follows.

$$I_{TM17} = I_{TM18} = p \cdot n/p \cdot I_{BIAS} = n \cdot I_{BIAS} \quad (45)$$

Figure 14:
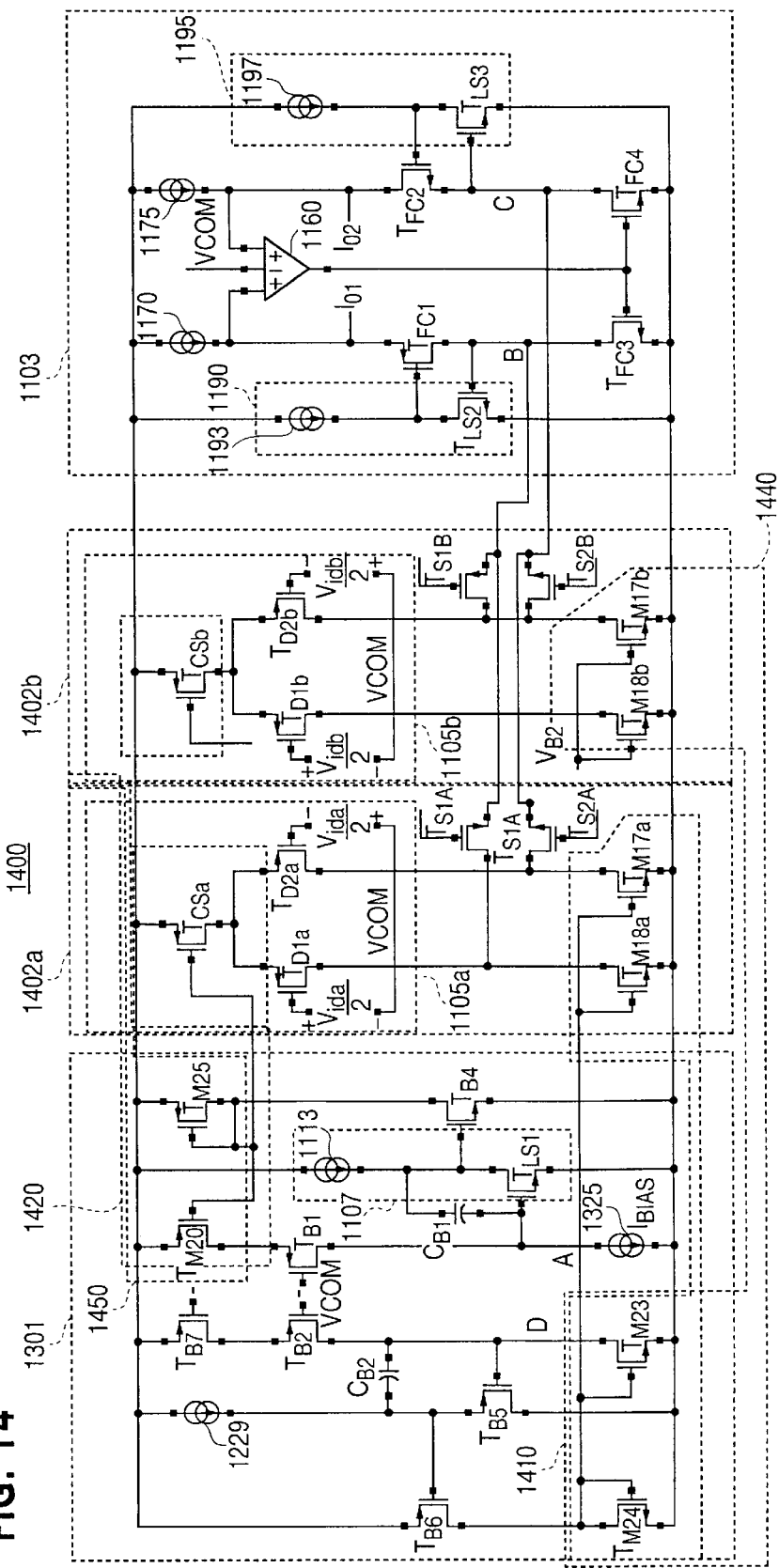
FIG. 14 is a circuit diagram of a precision bias for a transconductor according to a seventh preferred embodiment of the present invention having two switched input stages.

FIG. 14 is a circuit diagram showing a seventh preferred embodiment of the invention. The seventh preferred embodiment is similar to the fifth preferred embodiment shown in FIG. 13, except that it has two switched input stages. As shown in FIG. 14, the precision bias 1400 includes a bias circuit 1301, first and second input stages 1402a and 1402b, and an output stage 1103. First stage lower and upper current mirrors 1410 and 1420 are formed between the bias circuit 1301 and the first input stage 1402a. Second stage lower and upper current mirrors 1440 and 1450 are formed between the bias circuit 1301 and the second input step 1402b.

Each input stage 1402a, 1402b includes seventeenth and eighteenth mirror transistors $T_{M17a}$ and $T_{M18a}$, $T_{M17b}$ and $T_{M18b}$, first and second differential transistors $T_{D1a}$ and $T_{D2a}$, $T_{D1b}$ and $T_{D2b}$, and first and second current sources $T_{CSa}$ and $T_{CSb}$.

The first stage lower current mirror 1410 includes the twenty-third and twenty-fourth mirror transistors $T_{M23}$ and $T_{M24}$, and the seventeenth and eighteenth mirror transistors $T_{M17a}$ and $T_{M18a}$ from the first input stage 1402a. The upper current mirror 1420 includes the twentieth and twenty-fifth mirror transistors $T_{M20}$ and $T_{M25}$, and the first current source transistor $T_{CSa}$ from the first input stage 1402a.

The second stage lower current mirror 1440 includes the twenty-third and twenty-fourth mirror transistors $T_{M23}$ and $T_{M24}$, and the seventeenth and eighteenth mirror transistors $T_{M17b}$ and $T_{M18b}$ from the second input stage 1402b. The upper current mirror 1450 includes the twentieth and twenty-fifth mirror transistors $T_{M20}$ and $T_{M25}$, and the first current source transistor $T_{CSb}$ from the second input stage 1402b.

The first input stage 1402a is connected to the output stage 1103 through two first switches $T_{S1A}$ and $T_{S2A}$. The second input stage 1402b is connected to the output stage 1103 through two first switches $T_{S1B}$ and $T_{S2B}$.

FIG. 14 clearly shows that it is possible to multiplex several input stages into a single output folded-cascode without encountering any problems related to the DC currents flowing through the switching transistors ($T_{S1A}$, $T_{S1B}$, $T_{S2A}$, and $T_{S2B}$) into the output stage.

Although the schematics illustrate a PMOS-based transconductor design, complementary configurations may also be used. The same strategy of establishing the bias conditions is also equally applicable to BiCMOS or bipolar differential stages.

Figure 15:
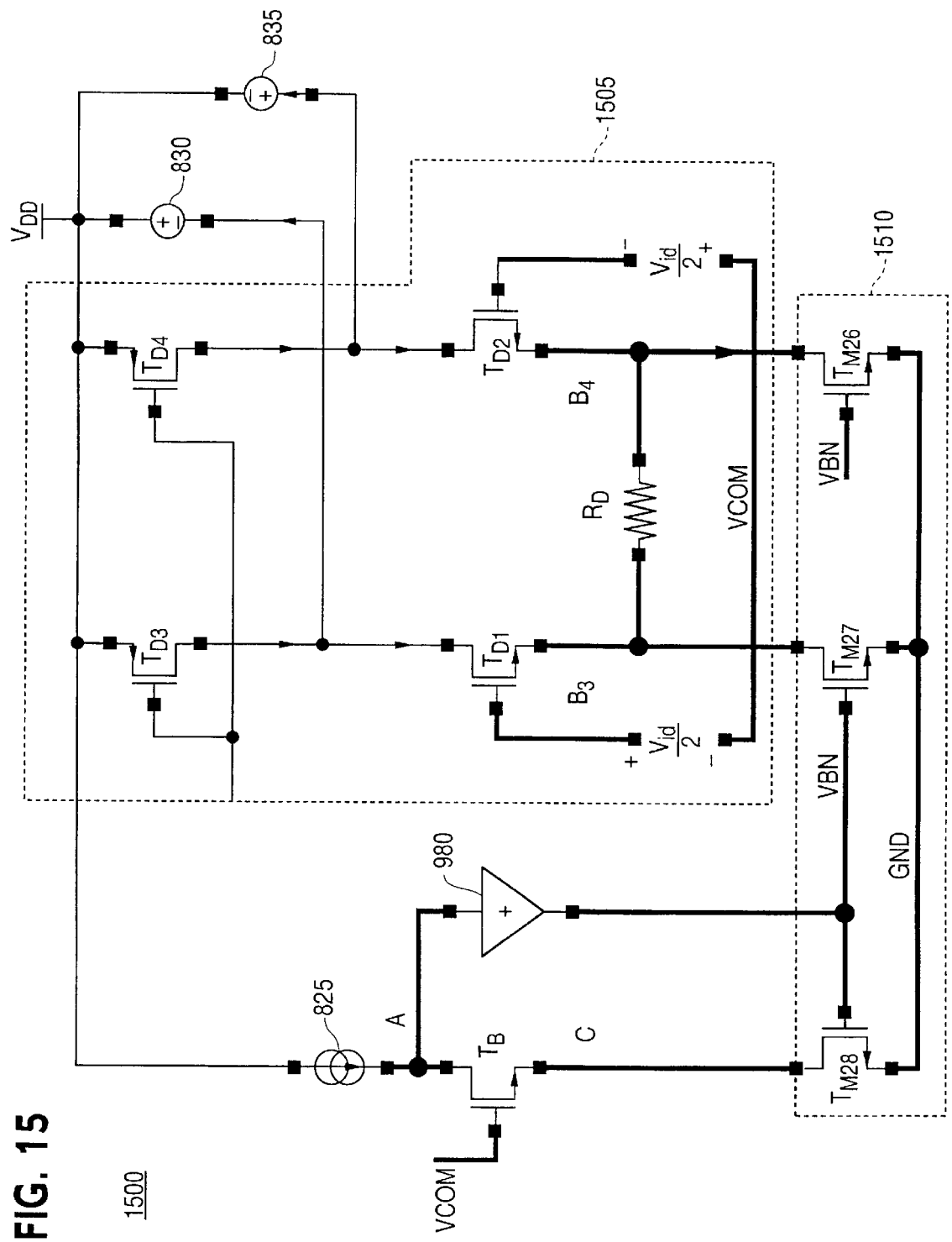
FIG. 15 is a circuit diagram of a high-swing cascode mirror tail-current generator according to a eighth preferred embodiment of the present invention having a source degenerated differential pair.

FIG. 15 is a circuit diagram showing a eighth preferred embodiment of the present invention. This embodiment shows a precision bias having a source degenerated differential pair that is part of the high-swing cascode mirror tail-current generator. As shown in FIG. 15, the precision bias 1500 includes a differential stage 1505, a current mirror 1510, a bias current source 825, first and second voltage sources 830 and 835, a bias transistor $T_B$, and a non-inverting amplifier 980. The differential stage 1505 includes first through fourth differential transistors $T_{D1}$, $T_{D2}$, $T_{D3}$, and $T_{D4}$, third and fourth voltage sources 830 and 835, and a differential resistor $R_D$. The current mirror 810 includes twenty-sixth through twenty-eighth mirror transistors $T_{M26}$ to $T_{M28}$.

This embodiment provides a merged mirror and differential pair. The differential pair $T_{D1}$ and $T_{D2}$ has source degeneration produced by the differential resistor $R_D$. The differential resistor $R_D$ may be passive or active. The two branches ($T_{D3}$-$T_{D1}$-$T_{M27}$; and $T_{D4}$-$T_{D2}$-$T_{M26}$) of the differential stage are biased with equal currents through a mirroring mechanism including the bias transistor $T_B$, the twenty-eighth mirror transistor $T_{M28}$, and the non-inverting amplifier 980.

The present invention has been described by way of exemplary embodiments, and many features and advantages of the present invention are apparent from the written description. Thus, it is intended that the appended claims cover all such features and advantages of the invention. Further, since numerous modifications and changes will readily occur to those skilled in the art, it is not desired that the invention be limited to the exact construction and operations illustrated and described above. Hence, all suitable modifications and equivalents may be resorted to as falling within the scope of the invention.

What is claimed is:

1. A precision bias for a differential transconductor, comprising:

a first bias transistor for conducting a first bias current, having a first gate connected to a common voltage and a first drain connected to a first reference node;

a first level-setting amplifier connected between a supply voltage and ground, having a first control voltage from the first reference node as input, and a first level-setting voltage as output;

a first inverting amplifier for generating a first current setting voltage by inverting, amplifying, and level shifting the first-level setting voltage;

a second bias transistor, having a second gate connected to a common voltage and a second drain connected to a second reference node, for conducting a second bias current;

a first current generator, connected to the supply voltage, for receiving as inputs the first current setting voltage and the first bias current from a source of the first bias transistor, and for generating the second bias current provided to a source of the second bias transistor and a tail current;

a second level-setting amplifier connected between the supply voltage and ground, having a second control voltage from the second reference node as input, and a second level-setting voltage as output;

a second inverting amplifier for generating a second current setting voltage by inverting, amplifying, and level shifting the second level-setting voltage;

a second current generator connected to ground, for receiving the second current setting voltage as a second current generator input and the second bias current from the second reference node, and for sinking first and second load currents equal to half the tail current to third and fourth reference nodes, respectively;

a differential transconductor for receiving the tail current from the first current generator, and supplying the first and second load currents to the third and fourth references nodes, respectively;

a third level-setting amplifier connected between the supply voltage and ground, having a third control voltage as input, and a third level-setting voltage as output;

a fourth level-setting amplifier connected between the supply voltage and ground, having a fourth control voltage as input, and a fourth level-setting voltage as output; and a folded cascode connected between the supply voltage and ground for receiving as inputs the third and fourth level-setting voltages, a third current from the third reference node, and a fourth current from the fourth reference node, and for providing the third control voltage and the fourth control voltage, wherein the first, second, and third control voltages are equal.

2. A precision bias for a differential transconductor, as recited in claim 1, wherein the first level-setting amplifier comprises a first level-setting current source and a first level-setting transistor connected in series, wherein a gate of the first level-setting transistor receives the first control voltage and a source of the first level-setting transistor is coupled to ground, and wherein a first output node between the first level-setting current source and the first level-setting transistor provides the first level-setting voltage.

3. A precision bias for a differential transconductor, as recited in claim 1, wherein the second level-setting amplifier comprises a second level-setting current source and a second level-setting transistor connected in series, wherein a gate of the second level-setting transistor receives the second control voltage and a source of the second level-setting transistor is coupled to ground, and wherein a second output node between the second level-setting current source and the second level-setting transistor provides the second level-setting voltage.

4. A precision bias for a differential transconductor, as recited in claim 1, wherein the third level-setting amplifier comprises a third level-setting current source and a third level-setting transistor connected in series, wherein a gate of the third level-setting transistor receives the third control voltage and a source of the third level-setting transistor is coupled to ground, and wherein a third output node between the third level-setting current source and the third level-setting transistor provides the third level-setting voltage.

5. A precision bias for a differential transconductor, as recited in claim 1, wherein the fourth level-setting amplifier comprises a fourth level-setting current source and a fourth level-setting transistor connected in series, wherein a gate of the fourth level-setting transistor receives the fourth control voltage and a source of the fourth level-setting transistor is coupled to ground, and wherein a fourth output node between the fourth level-setting current source and the fourth level-setting transistor provides the fourth level-setting voltage.

6. A precision bias for a differential transconductor, as recited in claim 1, wherein the first current generator comprises first, second, and third current generation transistors, the first current generation transistor being coupled to the first bias current, the second current generation transistor providing to the second bias current, and the third current generation transistor providing the tail current.

7. A precision bias for a differential transconductor, as recited in claim 6, wherein $$\frac{W_{D1}}{L_{D1}} = \frac{W_{D2}}{L_{D2}} = n \cdot \frac{W_B}{L_B},$$

and wherein $$\frac{W_{CG3}}{L_{CG3}} = 2n \cdot \frac{W_{CG1}}{L_{CG1}},$$

where $W_{D1}$ and $L_{D1}$, and $W_{D2}$ and $L_{D2}$, are widths and lengths of the first and second differential transistors, respectively, $W_{CG1}$ and $L_{CG1}$ and $W_{CG3}$ and $L_{CG3}$, are widths and lengths of the first and third current generation transistors, respectively, $W_B$ and $L_B$ are width and length of the first bias transistor, and n is an positive number.

8. A precision bias for a differential transconductor, as recited in claim 1, wherein the second current generator comprises fourth, fifth, and sixth current generation transistors.

9. A precision bias for a differential transconductor, as recited in claim 8, wherein $$\frac{W_{CG4}}{L_{CG4}} = \frac{W_{CG5}}{L_{CG5}} = n \cdot \frac{W_{CG6}}{L_{CG6}},$$

where $W_{CG4}$ and $L_{CG4}$, $W_{CG5}$ and $L_{CG5}$, and $W_{CG6}$ and $L_{CG6}$ are widths and lengths of the fourth, fifth and sixth current generation transistors, respectively.

10. A precision bias for a differential transconductor, as recited in claim 1, wherein the differential transconductor comprises first and second differential transistors, wherein sources of the first and second differential transistors are coupled to a first common node which receives the tail current, wherein the first differential transistor has a drain connected to the second reference node, wherein the second differential transistor has a drain connected to the third reference node, wherein the first and second differential transistors are driven with respect to the common voltage by first and second differential voltages, respectively, and wherein the first and second differential voltages are substantially identical in magnitude, but opposite in polarity.

11. The precision bias for a differential transconductor, as recited in claim 1, further comprising:

a bias current source for providing the first bias current to the first bias transistor, the bias current source having a first electrode connected to the first reference node and a second electrode connected to ground.

* * * * *